(12) United States Patent
Ukumori et al.

(10) Patent No.: US 11,181,584 B2
(45) Date of Patent: Nov. 23, 2021

(54) STORAGE AMOUNT ESTIMATION DEVICE, ENERGY STORAGE MODULE, STORAGE AMOUNT ESTIMATION METHOD, AND COMPUTER PROGRAM

(71) Applicant: GS Yuasa International Ltd., Kyoto (JP)

(72) Inventors: Nan Ukumori, Kyoto (JP); Yuichi Ikeda, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 145 days.

(21) Appl. No.: 16/498,280

(22) PCT Filed: Mar. 28, 2018

(86) PCT No.: PCT/JP2018/013053
§ 371 (c)(1),
(2) Date: Sep. 26, 2019

(87) PCT Pub. No.: WO2018/181620
PCT Pub. Date: Oct. 4, 2018

(65) Prior Publication Data
US 2020/0041574 A1    Feb. 6, 2020

(30) Foreign Application Priority Data

Mar. 29, 2017  (JP) .............................. JP2017-065005
Mar. 28, 2018  (JP) .............................. JP2018-062290

(51) Int. Cl.
*G01R 31/382*   (2019.01)
*H01M 10/48*    (2006.01)
*G01R 31/3842*  (2019.01)

(52) U.S. Cl.
CPC ........ *G01R 31/3842* (2019.01); *H01M 10/48* (2013.01)

(58) Field of Classification Search
CPC ................ G01R 31/38; G01R 31/3835; G01R 31/3842; G01R 31/388; G01R 31/382;
(Continued)

(56) References Cited

U.S. PATENT DOCUMENTS 9,500,713 B1    11/2016  Ghantous et al.
2002/0113595 A1  8/2002  Sakai et al.
(Continued)

FOREIGN PATENT DOCUMENTS

JP    2013-105519 A    5/2013
JP    2016-166817 A    9/2016

OTHER PUBLICATIONS

International Search Report (ISR) (PCT Form PCT/ISA/210), in PCT/JP2018/013053, dated Jun. 12, 2018.
(Continued)

*Primary Examiner* — Son T Le
(74) *Attorney, Agent, or Firm* — McGinn I.P. Law Group, PLLC.

(57) ABSTRACT

A storage amount estimation device estimates the storage amount of the energy storage device in which at least one of a positive electrode and a negative electrode contains an active material, at least two electrochemical reactions being generated in the active material depending on a transition of charge-discharge, the hysteresis between a storage amount-voltage value charge characteristic and a storage amount-voltage value discharge characteristic during generation of one of the electrochemical reactions being smaller than the hysteresis during generation of the other electrochemical reaction in the active material. The storage amount estimation device includes an estimator that estimates the storage amount using a voltage reference storage amount-voltage value characteristic obtained based on the storage amount-voltage value discharge characteristic when the one electro-
(Continued)

chemical reaction is generated more than the other electrochemical reaction.

10 Claims, 13 Drawing Sheets

(58) Field of Classification Search
CPC ..... G01R 31/36; G01R 31/396; H01M 10/48; Y02E 60/10; H02J 7/00; H02J 7/007; H02J 7/00716; H02J 7/0048
See application file for complete search history.

(56) References Cited

U.S. PATENT DOCUMENTS

| | | |
|---|---|---|
| 2006/0091863 A1 | 5/2006 | Melichar |
| 2010/0213946 A1* | 8/2010 | Kirchev ............... H01M 10/48 324/427 |
| 2014/0320141 A1 | 10/2014 | Kaburagi et al. |
| 2015/0355285 A1 | 12/2015 | Nishigaki et al. |
| 2016/0254542 A1 | 9/2016 | Konishi et al. |

OTHER PUBLICATIONS

Extended European Search Report dated Mar. 4, 2020 for European Patent Application No. 18774740.7-1010.

* cited by examiner

Electric quantity/mAh g$^{-1}$

STORAGE AMOUNT ESTIMATION DEVICE, ENERGY STORAGE MODULE, STORAGE AMOUNT ESTIMATION METHOD, AND COMPUTER PROGRAM

TECHNICAL FIELD

The present invention relates to a storage amount estimation device that estimates a storage amount such as SOC (State Of Charge) of an energy storage device, an energy storage module including the storage amount estimation device, a storage amount estimation method, and a computer program.

BACKGROUND ART

There is a demand for high capacity in a secondary battery for vehicle used in an electric vehicle, a hybrid vehicle, and the like and an industrial secondary battery used in a power storage device, a solar power generating system, and the like. Various investigations and improvements have been made so far, and it is difficult to achieve a higher capacity only by improving an electrode structure and the like. For this reason, development of a positive electrode material having a higher capacity than the current material is underway.

Conventionally, a lithium transition metal composite oxide having an α-NaFeO$_2$ type crystal structure have been studied as a positive active material for a nonaqueous electrolyte secondary battery such as a lithium ion secondary battery, and a nonaqueous electrolyte secondary battery in which LiCoO$_2$ is used has widely been used. A discharge capacity of LiCoO$_2$ ranged from about 120 mAh/g to about 160 mAh/g.

When the lithium transition metal composite oxide is represented by LiMeO$_2$ (Me is a transition metal), desirably Mn was used as Me. In a case where a molar ratio Mn/Me of Mn in Me exceeds 0.5 with Mn contained as Me, a structure changes to a spinel type when charge is performed, and a crystal structure cannot be maintained. For this reason, charge-discharge cycle performance is significantly inferior.

Various LiMeO$_2$ type active materials in which the molar ratio Mn/Me of Mn in Me is less than or equal to 0.5 and the molar ratio Li/Me of Li to Me is substantially 1 have been proposed and put into practical use. A positive active material containing LiNi$_{1/2}$Mn$_{1/2}$O$_2$ and LiNi$_{1/3}$Co$_{1/3}$Mn$_{1/3}$O$_2$, which are the lithium transition metal composite oxide, has the discharge capacity of 150 mAh/g to 180 mAh/g.

In contrast to the LiMeO$_2$ type active material, there is known what is called a lithium-excess active material containing a lithium transition metal composite oxide in which the molar ratio Mn/Me of Mn in Me exceeds 0.5 and the composition ratio Li/Me of Li to the ratio of transition metal (Me) is greater than 1.

A lithium-excess type Li$_2$MnO$_3$-based active material has been studied as the high-capacity positive electrode material. This material has a property of a hysteresis in which a voltage value and an electrochemical characteristic with respect to the same SOC (State Of Charge) change depending on a charge history and a discharge history.

A method for estimating the SOC in a secondary battery includes an OCV method (voltage reference) for determining the SOC based on a correlation (SOC-OCV curve) in which the OCV (Open Circuit Voltage) and the SOC of the secondary battery are correlated with each other in a one-to-one manner and a current integration method for determining the SOC by integrating a charge-discharge current value of the secondary battery.

When an electrode material having the hysteresis is used, it is difficult to estimate the SOC by the OCV method because the voltage value is not uniquely decided with respect to the SOC. Because the SOC-OCV curve is not uniquely decided, it is difficult to predict dischargeable energy at a certain point of time.

When the SOC is calculated by the current integration method, the following equation (1) is used.

$$SOC_i = SOC_{i-1} + I_i \times \Delta t_i / Q \times 100 \quad (1)$$

SOC$_i$: current SOC
SOC$_{i-1}$: previous SOC
I: current value
Δt: time interval
Q: battery capacity (available capacity)

When the current integration is continued for a long time, a measurement error of the current sensor is accumulated. Because the battery capacity decreases with time, an estimation error of the SOC estimated by the current integration method increases with time. Conventionally, an OCV reset in which the SOC is estimated by the OCV method to reset the error accumulation is performed when the current integration is continued for a long time.

Also in the energy storage device in which the electrode material having the hysteresis is used, an error is accumulated when the current integration is continued. However, because the voltage value is not uniquely decided with respect to the SOC, it is difficult to estimate the SOC by the OCV method (to perform the OCV reset).

Thus, it is difficult to accurately estimate the SOC in the energy storage device by the current SOC estimation technique.

In a secondary battery control device disclosed in Patent Document 1, a relationship between the SOC and the OCV in a discharge process is stored as discharging OCV information for each switching SOC that is the SOC when the charge is switched to the discharge. The secondary battery control device is configured to calculate the SOC in the discharge process of the secondary battery based on the switching SOC when the charge is actually switched to the discharge and the discharging OCV information.

PRIOR ART DOCUMENT

Patent Document

Patent Document 1: JP-A-2013-105519

SUMMARY OF THE INVENTION

Problems to be Solved by the Invention

In the secondary battery control device of Patent Document 1, the SOC-OCV curve during the discharge is selected from the voltage values reached by the charge, and the SOC is estimated based on the SOC-OCV curve and the current voltage value. In the secondary battery control device, the SOC cannot be estimated based on the voltage value of a charge process. When the charge-discharge is repeated with a complicated pattern, the secondary battery can hardly be monitored with high accuracy.

An object of the present invention is to provide a storage amount estimation device that can estimate a storage amount of an energy storage device containing an active material in which a storage amount-voltage value characteristic exhibits a hysteresis, an energy storage module including the storage amount estimation device, a storage amount estimation method, and a computer program.

As used herein, the storage amount means the SOC, a power dischargeable amount, and the like.

Means for Solving the Problems

According to one aspect of the present invention, a storage amount estimation device that estimates a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge during generation of one of the electrochemical reactions being smaller than a hysteresis during generation of the other electrochemical reaction in the active material, the storage amount estimation device includes an estimator that estimates the storage amount using a voltage reference storage amount-voltage value characteristic obtained based on the storage amount-voltage value discharge characteristic when the one electrochemical reaction is generated more than the other electrochemical reaction.

As used herein, "when one electrochemical reaction is generated" includes "when a group of electrochemical reactions simultaneously take place". "When the other electrochemical reaction occurs" includes "when a group of electrochemical reactions simultaneously take place".

The storage amount-voltage value charge characteristics and the storage amount-voltage value discharge characteristic may be acquired when the energy storage module is charged from the full discharge state to the full charge state, or when the energy storage module is discharged from the full charge state to the full discharge state (hereinafter, referred to as full charge or full discharge). The difference between the storage amounts of both the characteristics at the identical voltage value (Δ storage amount) corresponds to another electrochemical reaction. One electrochemical reaction and the other electrochemical reaction are substantially independently generated. That is, a reaction amount of the other electrochemical reaction corresponds to the Δ storage amount, and hardly affects one electrochemical reaction.

The voltage reference storage amount-voltage value characteristic may be acquired by moving the storage amount-voltage value discharge characteristic toward the storage amount-voltage value charge characteristic based on the storage amount-voltage value discharge characteristics in which one electrochemical reaction is generated. That is, the voltage reference storage amount-voltage value characteristic starting from each voltage value has the shape, in which the same storage amount-voltage value discharge characteristic is moved toward the storage amount-voltage value charge characteristic based on one electrochemical reaction and the voltage value at each starting point is cut as the upper end.

Advantages of the Invention

According to the above configuration, the storage amount of the high-capacity energy storage device containing the active material having the storage amount-voltage value characteristic exhibiting the hysteresis can easily and satisfactorily be estimated.

Only the storage amount-voltage value discharge characteristic and the storage amount-voltage value charge characteristic are actually measured, and a work amount is small.

As compared with the case where the voltage reference storage amount-voltage value characteristic to be located between the adjacent voltage reference storage amount-voltage value characteristics is supplemented by the interpolation calculation, the voltage reference storage amount-voltage value characteristic responsive to each reached voltage value is directly generated from the measured storage amount-voltage value discharge characteristic, so that the accuracy of the storage amount estimation is improved.

When the voltage reference storage amount-voltage value characteristic is acquired according to the degradation of the energy storage device, only the storage amount-voltage value discharge characteristic and the storage amount-voltage value charge characteristic are actually measured, and the work amount is small in a use period of the energy storage device.

Because of the use of the voltage value, the storage amount is not limited to the SOC, and the current amount of energy, such as amount of power, which is stored in the energy storage device, can be estimated. The dischargeable energy up to SOC 0% and the charge energy required up to SOC 100% can be predicted based on the charge-discharge curve.

MODE FOR CARRYING OUT THE INVENTION

Hereinafter, the present invention will be specifically described based on the drawings illustrating embodiments of the present invention.

(Outline of Embodiment)

An electrode assembly of an energy storage device according to the embodiment contains an active material in which a storage amount-voltage value characteristic has a hysteresis.

Hereinafter, the case where the active material of the energy storage device is a Li-excess $LiMeO_2$—$Li_2MnO_3$ solid solution containing Ni and an electric quantity is the SOC will be described as an example.

Figure 1:
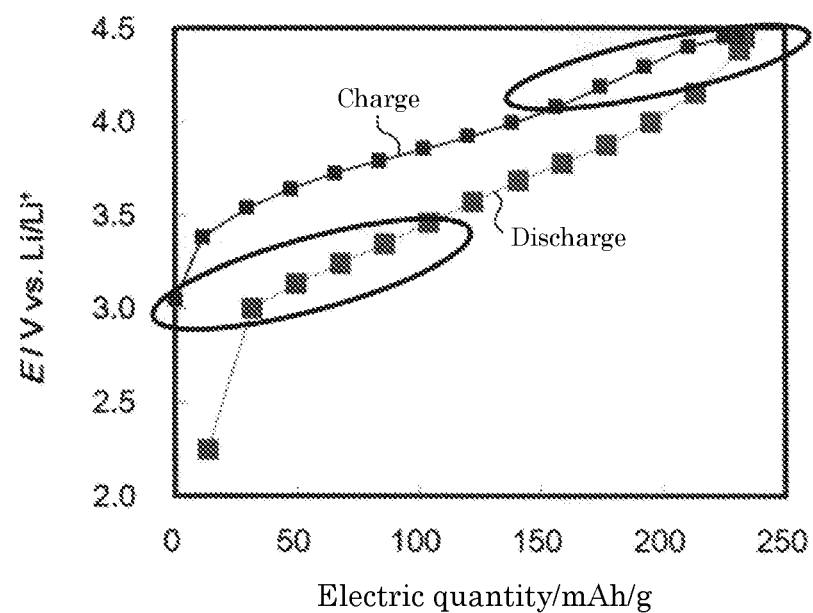
FIG. 1 is a graph illustrating a result in which a relationship between an electric quantity and a charge-discharge voltage value is obtained with respect to a Li-excess active material.

FIG. 1 is a graph illustrating a result in which a relationship between an electric quantity and a charge-discharge voltage value is obtained using a lithium cell of a counter electrode Li with respect to a Li-excess active material. A horizontal axis indicates the electric quantity (mAh/g), and a vertical axis indicates the charge-discharge voltage value E (potential difference based on equilibrium potential VvsLi/$Li^+$:Li/$Li^+$). At this point, the electric quantity corresponds to the SOC.

As illustrated in FIG. 1, an increase (charge) in SOC and a decrease (discharge) in SOC differ from each other in the voltage value. That is, the voltage values for the same SOC are different from each other, and have the hysteresis. For the active material, a high SOC region is smaller than a low SOC region in the potential difference with respect to the same SOC, and the hysteresis is small.

In the embodiment, a small-hysteresis region where the SOC can be estimated from the voltage value using a voltage reference SOC-OCV curve (to be described later) is determined, and the SOC is estimated in the region.

Figure 2:
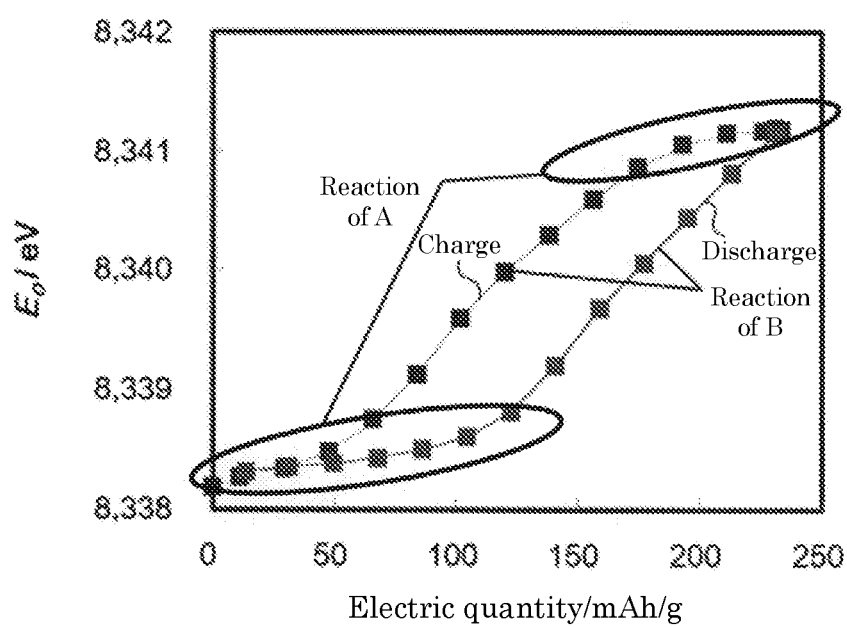
FIG. 2 is a graph illustrating a transition of K absorption edge energy of Ni in a Li-excess active material calculated by X-ray absorption spectroscopy (XAFS measurement) with respect to the electric quantity.

FIG. 2 is a graph illustrating a transition of K absorption edge energy of Ni in the Li-excess active material calculated by X-ray absorption spectroscopy (XAFS measurement) with respect to the electric quantity. The horizontal axis indicates the electric quantity (mAh/g), and the vertical axis indicates K absorption edge energy $E_0$ (eV) of Ni.

Figure 3:
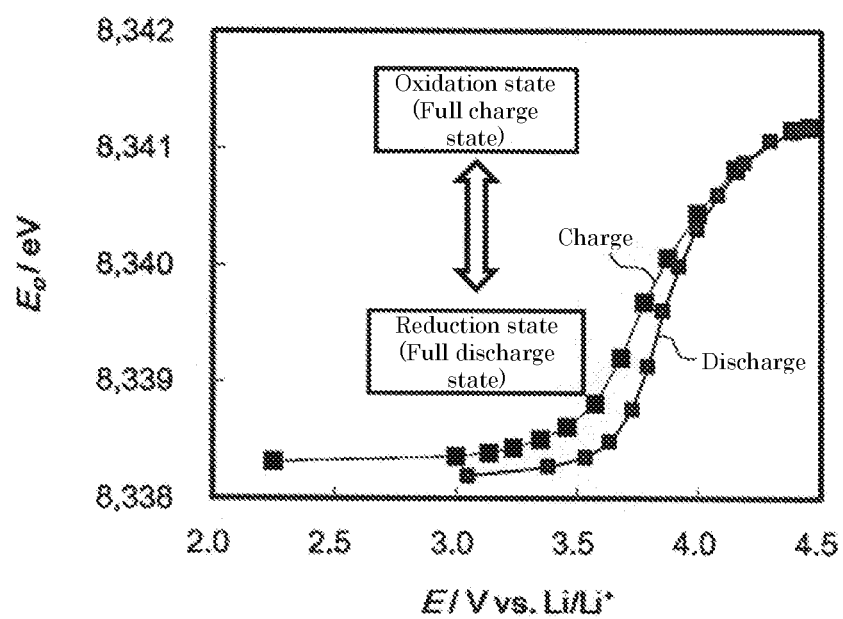
FIG. 3 is a graph illustrating the transition of the K absorption edge energy of Ni during charge-discharge.

FIG. 3 is a graph illustrating the transition of the K absorption edge energy of Ni during charge-discharge. The horizontal axis indicates the charge-discharge voltage value E (VvsLi/$Li^+$), and the vertical axis indicates the K absorption edge energy $E_0$ (eV) of Ni.

As illustrated in FIG. 2, in the high SOC region, the transition of the K absorption edge energy of Ni in a charge reaction is not matched with the transition of the energy in a discharge reaction. In the low SOC region, the transition of the energy in the discharge reaction is not matched with the transition of the energy in the charge reaction. That is, it can be seen that a redox reaction except for Ni that has the hysteresis is mainly generated (it is assumed that this reaction is A). The reaction of A is an oxidation reaction in the high SOC region, and is a reductive reaction in the low SOC region.

In a middle SOC region, the K absorption edge energy of Ni in the charge reaction and discharge reaction changes substantially linearly with respect to the SOC.

As illustrated in FIG. 3, in the high SOC region where the charge-discharge voltage value ranges substantially from 3.7 V to 4.5 V, the charge and the discharge are substantially matched with each other in the K absorption edge energy of Ni. When the K absorption edge energy of Ni is the same, it is considered that a valence of Ni is equal, that a valence change of Ni corresponds substantially to a voltage value of at 1:1 in this voltage range, and that Ni reacts reversibly. That is, in the SOC region, the redox reaction having a small hysteresis indicated by the SOC-OCP characteristic is mainly generated (it is assumed that this reaction is B). The OCP means an open circuit potential.

In the SOC region, a reaction amount of B is larger than a reaction amount of A, and resultantly the hysteresis is smaller than that in the low SOC region.

In the embodiment, the lower voltage value (lower limit voltage value) in the region where the reaction of B is mainly generated is obtained by an experiment. At the lower limit voltage value, existence of the hysteresis is substantially switched. The oxidation amount and the reduction amount of the reaction of B are considered to be small. When a determination that a charge state or a discharge state exists in a region corresponding to a voltage region that is greater than or equal to the lower limit voltage value is made based on the increase and decrease of the voltage value, the SOC is estimated by the voltage reference based on a reached voltage value.

In this case, as an example, the description is given by focusing only on an oxidation-reduction reaction of Ni. However, the reaction of B is not limited to the oxidation-reduction reaction of Ni. The reaction of B refers to a reaction with the small hysteresis of the storage amount-voltage value characteristic in one or a group of reactions generated by the active material according to the transition of the charge-discharge.

The case where the negative electrode of the energy storage device contains the active material having the large hysteresis will be described below. The case where the negative electrode includes SiO and graphite as active materials will be described as an example. The hysteresis generated during the electrochemical reaction of SiO is larger than the hysteresis generated during the electrochemical reaction of graphite.

Figure 4:
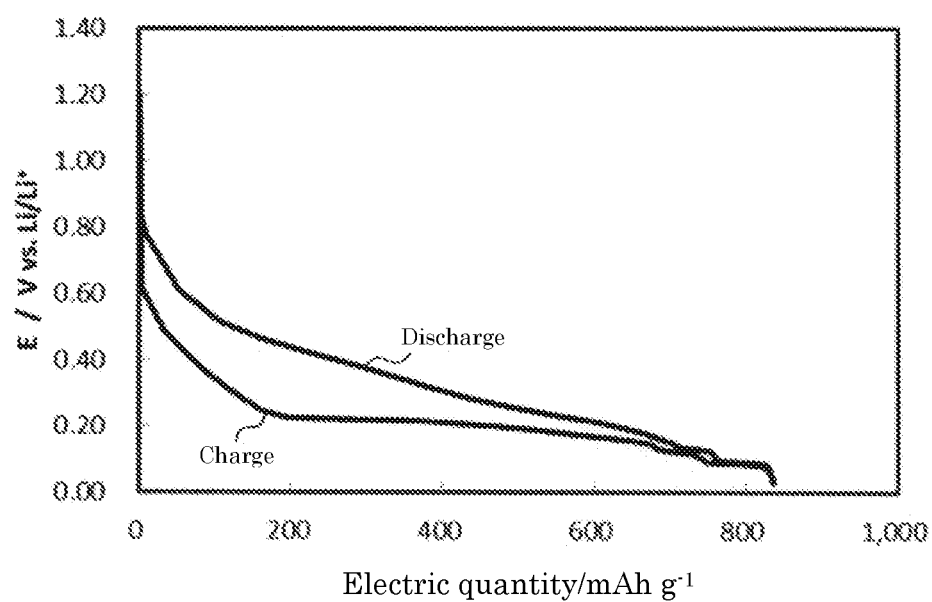
FIG. 4 is a graph illustrating the result in which the relationship between the electric quantity and the charge-discharge voltage value is obtained with respect to an energy storage device including a negative electrode containing an active material exhibiting a hysteresis.

FIG. 4 is a graph illustrating a result in which the relationship between the electric quantity and the charge-discharge voltage value is obtained using the lithium cell of the counter electrode Li with respect to the energy storage device. A horizontal axis indicates the electric quantity (mAh/g), and a vertical axis indicates a charge-discharge voltage value (VvsLi/$Li^+$:Li/$Li^+$ potential difference based on the equilibrium potential). At this point, the electric quantity corresponds to the SOC.

As illustrated in FIG. 4, the charge curve and the discharge curve differ from each other in the voltage value. That is, the voltage values for the same SOC are different from each other, and have the hysteresis. For the active material, a high SOC region is smaller than a low SOC region in the potential difference with respect to the same SOC, and the hysteresis is small.

Figure 5:
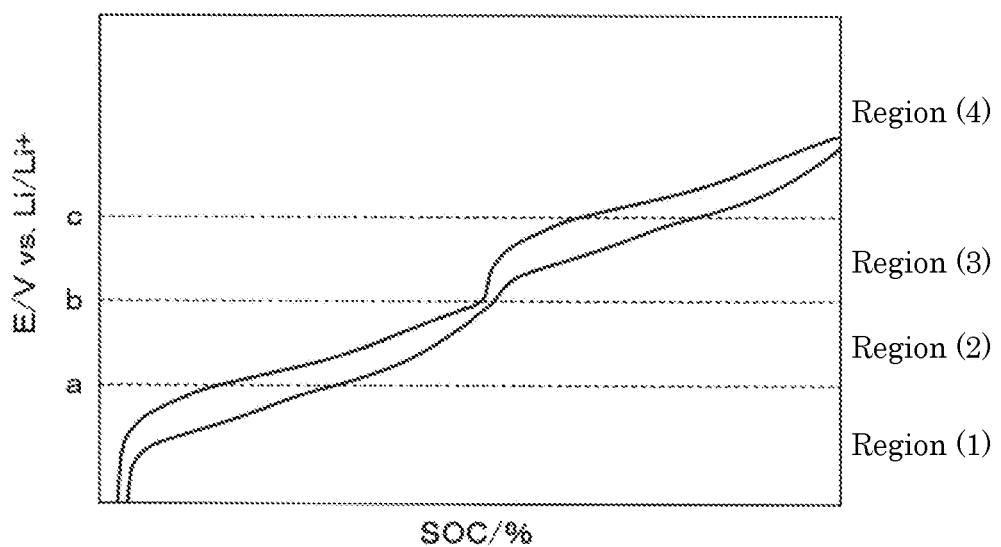
FIG. 5 illustrates an example of a charge-discharge curve when a region having a large hysteresis and a region having a small hysteresis appear alternately with increasing SOC (State Of Charge).

FIG. 5 illustrates the charge-discharge curve when the region having the large hysteresis and the region having the small hysteresis appear alternately with increasing SOC (or voltage value). A horizontal axis indicates SOC (%), and a vertical axis indicates a voltage value (V).

When the positive electrode contains a plurality of Li-excess active materials having different positive electrodes, when the negative electrode contains a plurality of active materials having the large hysteresis, and when each of the positive electrode and the negative electrode contains the active material having the large hysteresis, sometimes the region having the large hysteresis and the region having the small hysteresis appear alternately, or appear while overlapping each other.

In a region (2) where the voltage value ranges from a to b in FIG. 5, the hysteresis is smaller than that in a region (1) where the voltage value is less than or equal to a. A reaction of C having the large hysteresis and a reaction of D having the small hysteresis are generated in the region (2). Because the reaction amount of D is large in the region (2), the hysteresis is smaller than that in the region (1) as a result.

In a region (4) where the voltage value is greater than or equal to c in FIG. 5, the hysteresis is smaller than that in the region (3) where the voltage value ranges from b to c. A reaction of E having the large hysteresis and a reaction of F having the small hysteresis are generated in the region (4). Because the reaction amount of E is large in the region (4), the hysteresis is smaller than that in the region (3) as a result.

The lower limit voltage value a in the region (2) and the lower limit voltage value c in the region (4) are obtained by the experiment. When the determination that the charge state or discharge state exists in the region (2) corresponding to the voltage region greater than or equal to the lower limit voltage value a is made based on the increase or decrease of the voltage value, and when the determination that the charge state or discharge state exists in the region (4) corresponding to the voltage region greater than or equal to the lower limit voltage value c is made based on the increase or decrease of the voltage value, the SOC is estimated by the voltage reference based on the reached voltage value (to be described later).

The region of the voltage value is not limited to the case where the region of the voltage value is divided into two or four regions as described above. When a plurality of electrochemical reactions is generated depending on the active material of the positive electrode or negative electrode to cause the region having the large hysteresis and the region having the small hysteresis to appear alternately, the SOC is relatively high and the SOC is estimated by the voltage reference in the region where the SOC is relatively high and the hysteresis is small.

For the active material having the reaction of A and the reaction of B will be described below on the assumption that the reaction of B is frequently generated at the SOC of 40% or more and that the corresponding lower limit voltage value of E0 V is obtained by a charge-discharge experiment.

When the OCV can be measured as the lower limit voltage value, the lower limit voltage value may be constant. When a CCV (Closed Circuit Voltage) is measured as the lower limit voltage value, update may be performed by lowering the lower limit voltage value according to a degree of degradation associated with the use of the energy storage device. An increase in internal resistance and an increase in deviation of capacity balance can be cited as an example of a cause of the degradation of the energy storage device. The deviation of the capacity balance means that a difference between an amount of side reaction except for a charge-discharge reaction in the positive electrode and an amount of side reactions except for the charge-discharge reaction in the negative electrode is generated to incompletely charge one of the positive electrode and the negative electrode, and the positive and negative electrodes have different capacities in which charged ions can reversibly enter and leave the electrode. In a typical lithium ion battery, because the side reaction amount in the positive electrode is smaller than the side reaction amount in the negative electrode, when the "deviation of capacity balance" increases, the negative electrode cannot fully be charged and the electric quantity that can be reversibly taken out from the energy storage device decreases.

After the voltage value exceeds the lower limit voltage value by charging the battery, namely, the voltage value becomes a nobler potential than the lower limit voltage value, and the reached maximum voltage value is taken as a reached voltage value.

A plurality of voltage reference SOC-OCV curves (hereinafter referred to as reference SOC-OCV curves) from a lower limit voltage value to a plurality of reached voltage values are stored in the memory table of the storage amount estimation device. For example, an SOC-OCV curve a from the lower limit voltage value E0 V to the reached voltage value E1 V, an SOC-OCV curve b from the lower limit voltage value E0 V to the reached voltage value E2 V, and an SOC-OCV curve c from the lower limit voltage value E0 V to a reached voltage value E3 V are stored in the table 63b. At this point, E1>E2>E3 holds. Although also referred to in a comparative test (to be described later), the SOC-OCV curves a, b, c are not illustrated in the drawings. In the table, the SOC-OCV curves corresponding to all the reached voltage values are stored not discretely, but continuously. Instead of storing continuously the SOC-OCV curves, the SOC-OCV curve is discretely prepared, and a curve to be located between the adjacent SOC-OCV curves may be supplemented by interpolation calculation.

The reference SOC-OCV curve is obtained as follows.

A discharge OCV curve and a charge OCV curve are obtained when SOC (%) is changed from 40% to 100% for each point of SOC (%) from 40% to 100%. For example, the discharge OCV curve can be obtained by passing a minute current in the discharge direction and measuring the voltage value at that time. Alternatively, the discharge is performed from the charge state to each SOC and stopped, and the stable voltage value can be measured. Similarly, the charge OCV curve can be obtained when the above measurement is performed in a charge direction. Preferably the OCV curve obtained by averaging a discharge OCV curve and a charge OCV curve is used because the active material has the slight hysteresis even if the SOC is greater than or equal to 40%. The discharge OCV curve and the charge OCV curve, or corrected those may be used.

After a discharge OCP curve and a charge OCP curve are obtained, the discharge OCP curve and the charge OCP curve may be corrected to the reference SOC-OCV curve for the energy storage device.

A result in which a difference between the SOC estimation based on the reference SOC-OCV curve and the SOC estimation based on the conventional current integration is compared during the repetition of the charge-discharge will be described below.

Figure 6:
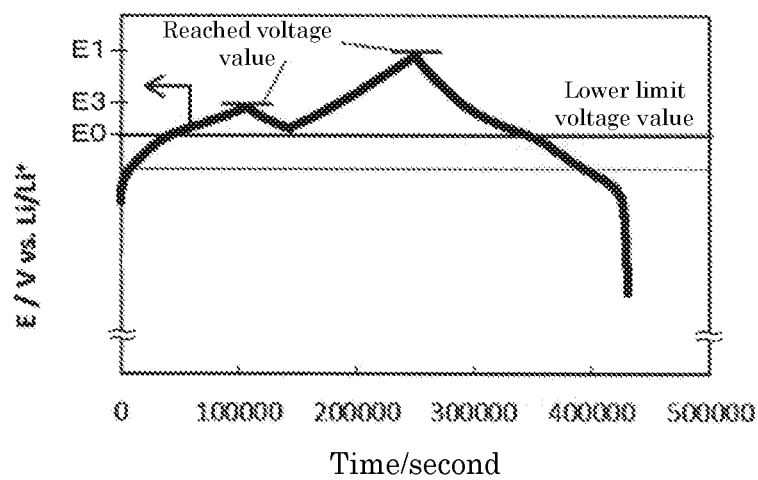
FIG. 6 is a graph illustrating the transition of a voltage value with respect to time during the charge-discharge.

FIG. 6 is a graph illustrating the transition of the voltage value with respect to time during the charge-discharge. The horizontal axis indicates time (second), and the vertical axis indicates a charge-discharge voltage value (VvsLi/Li$^+$). In FIG. 6, because the charge-discharge is performed by a minute electric current, it is checked whether the voltage value during energization indicates the substantially same value as the OCV.

As illustrated in FIG. 6, the first charge was performed, the voltage value exceeded the lower limit voltage value E0 V and reached E3 V, and the first discharge was performed. After the voltage value reached E0 V, the second charge was performed, the voltage value reached E1 V, and the second discharge was performed.

E3 V is stored as the first reached voltage value in the table. The reached voltage value is updated at a point of time the voltage value exceeds E3 V during the second charge. The SOC-OCV curve c is used until the voltage value reaches E3 V in the first discharge and the second charge. Another SOC-OCV curve stored in the table is used between E3 V and E1 V of the second charge. The SOC-OCV curve a is used from E1 V of the second discharge to E0 V of the lower limit voltage value.

Figure 7:
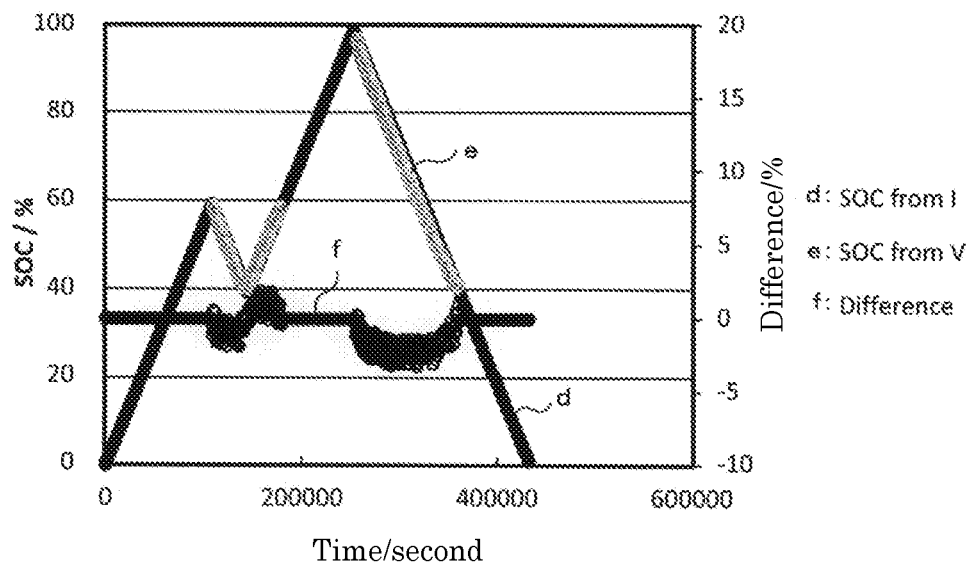
FIG. 7 is a graph illustrating a difference between estimation of the SOC by the voltage reference of the embodiment and estimation of the SOC by the current integration when the charge-discharge in FIG. 6 is performed on a battery of an initial product.

FIG. 7 is a graph illustrating a difference between the estimation of the SOC by the voltage reference of the embodiment and the estimation of the SOC by the conventional current integration when the charge-discharge in FIG. 6 is performed on the energy storage device of an initial product. The horizontal axis indicates time (second), the left vertical axis indicates SOC (%), and the right vertical axis indicates the difference (%). In the estimation of the SOC by the current integration as a control, the discharge capacity is previously checked and a highly accurate ammeter is used, so that the discharge capacity of Q and the current value of I in equation (1) are accurate. It is considered that the discharge capacity of Q and the current value of I approximate the true values.

In FIG. 7, d is the transition of the SOC obtained by the current integration, e is the transition of the SOC obtained by the voltage reference using the SOC-OCV curves c and a, and f is the difference. The difference was obtained by (SOC calculated by voltage reference)–(SOC calculated by current integration).

As can be seen from FIG. 7, the difference is less than about ±4% and is small.

From the above, it was checked that the accuracy of the SOC estimation by the reference SOC-OCV curve is good.

However, when the reference SOC-OCV curves corresponding to all the reached voltage values are continuously stored in the table, a work amount becomes enormous because the discharge OCV curve and charge OCV curve are actually measured.

The accuracy of the SOC estimation is lowered when the SOC-OCV curve is discretely prepared to supplement the curve to be located between the adjacent SOC-OCV curves by the interpolation calculation.

Additionally, the data amount becomes enormous in a use period of the energy storage device because the voltage reference SOC-OCV curve is prepared at predetermined time intervals according to the degradation of the energy storage device.

As illustrated in FIGS. 2 and 3, in the high-SOC region, only the oxidation-reduction reaction of B and the oxidation reaction of A are generated with the small hysteresis, and the reductive reaction of A is hardly generated. Once the oxidation reaction of A is generated at a certain potential, the oxidation reaction of A is not generated at the voltage until the reductive reaction of A that is paired with the oxidation reaction is generated. Thus, once the oxidation reaction of A is generated, only the oxidation-reduction reaction of B having no hysteresis is generated from the lower limit voltage value to the reached upper limit voltage, and the charge-discharge curve shape is matched with the discharge curve shape during the full discharge at the same voltage.

The discharge SOC-OCV curve during the fully discharge and the charge SOC-OCV curve during the fully charge are prepared. It is assumed that ΔSOC is a difference between the SOC at a certain voltage value on the discharge SOC-OCV curve and the SOC at the same voltage value on the charge SOC-OCV curve.

The reaction of A and the reaction of B are substantially independently generated. The reaction amount of A corresponds to ΔSOC, and does not affect the reaction of B. For this reason, it was considered that the reference SOC-OCV curve can easily be obtained by performing correction using ΔSOC based on the discharge SOC-OCV curve of the reaction of B. The reference SOC-OCV curve starting from each reached voltage value has a shape, in which the same discharge SOC-OCV curve is corrected while moved toward the charge SOC-OCV curve based on the same reaction of B and the reached voltage value at each starting point is cut as an upper end.

Figure 8:
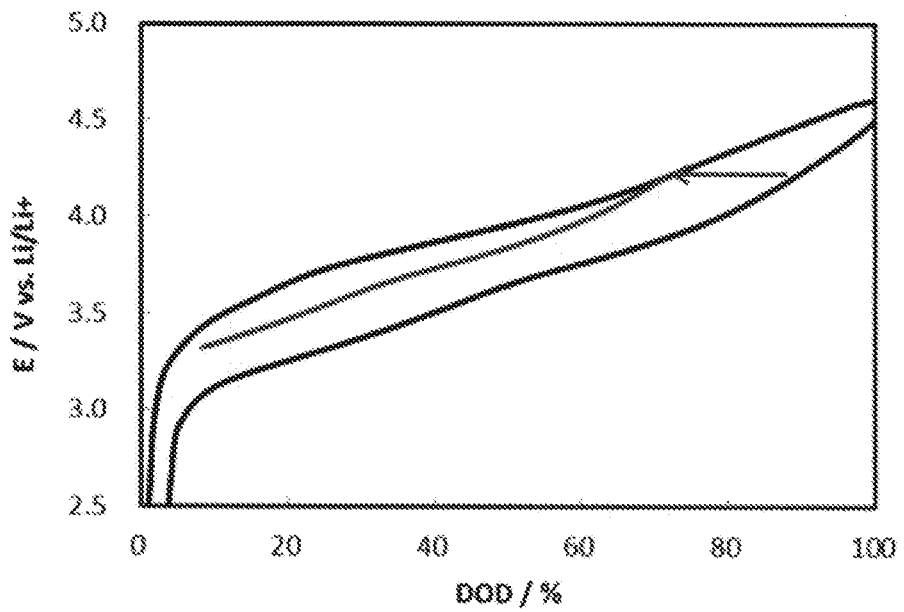
FIG. 8 is an explanatory view illustrating a principle of SOC estimation of an embodiment.

FIG. 8 is an explanatory view illustrating this principle. The horizontal axis indicates SOC [%], and the vertical axis indicates the charge-discharge voltage value E (VvsLi/Li$^+$).

In FIG. 8, (1) expresses the full discharge SOC-OCV curve, and (2) expresses the full charge SOC-OCV curve. The difference between the SOC at a certain reached voltage value on the discharge SOC-OCV curve (1) and the SOC at the same reached voltage value on the charge SOC-OCV curve (2) is ΔSOC. A SOC-OCV curve (3) is obtained by sliding the discharge SOC-OCV curve (1) onto the side of the charge SOC-OCV curve (2) in parallel with the horizontal axis by this ΔSOC. The SOC-OCV curve (3) in the range from the lower limit voltage value to the reached voltage value is taken as the reference SOC-OCV curve. When estimating the SOC, the SOC corresponding to the acquired voltage value is read using the reference SOC-OCV curve.

Figure 9:
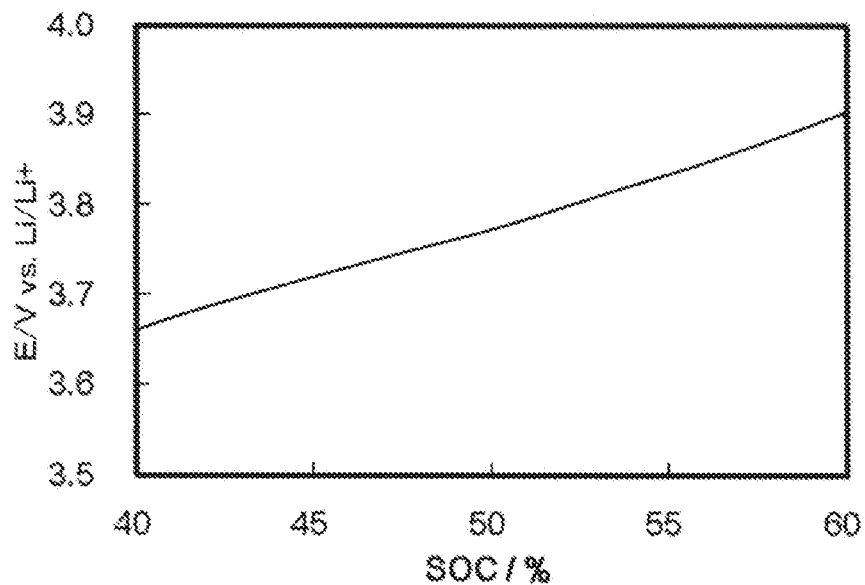
FIG. 9 illustrates an SOC-OCV curve obtained by measurement when the SOC ranges from 40% to 60%.

FIG. 9 illustrates the SOC-OCV curve obtained by the measurement when the SOC ranges from 40% to 60%. The horizontal axis indicates SOC (%), and the vertical axis indicates the charge-discharge voltage value E (a potential difference based on the equilibrium potential VvsLi/Li$^+$:Li/Li$^+$).

Figure 10:
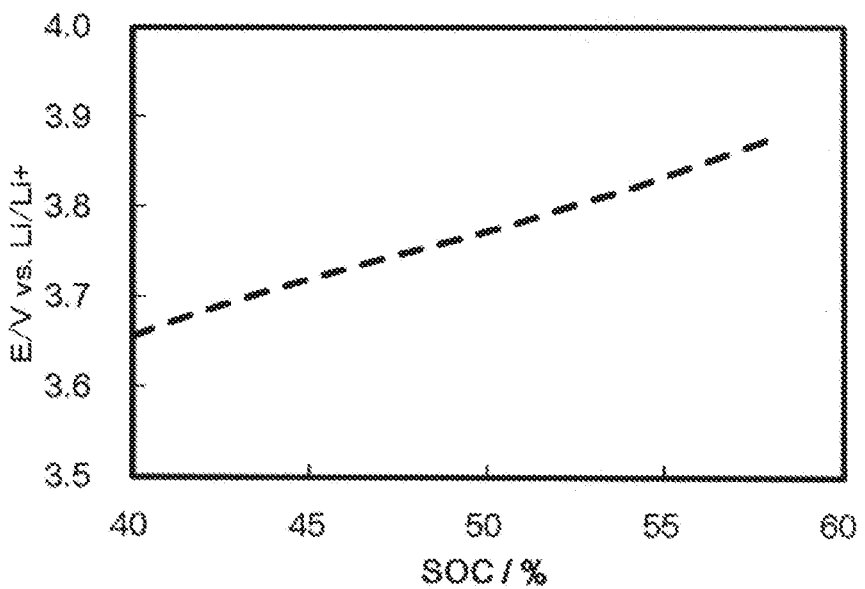
FIG. 10 illustrates a reference SOC-OCV curve obtained by the method of the embodiment when the SOC ranges from 40% to 60%.

FIG. 10 illustrates the reference SOC-OCV curve obtained by the above method when the SOC ranges from 40% to 60%. The horizontal axis indicates SOC (%), and the vertical axis indicates the charge-discharge voltage value E (a potential difference based on the equilibrium potential VvsLi/Li$^+$:Li/Li$^+$).

Figure 11:
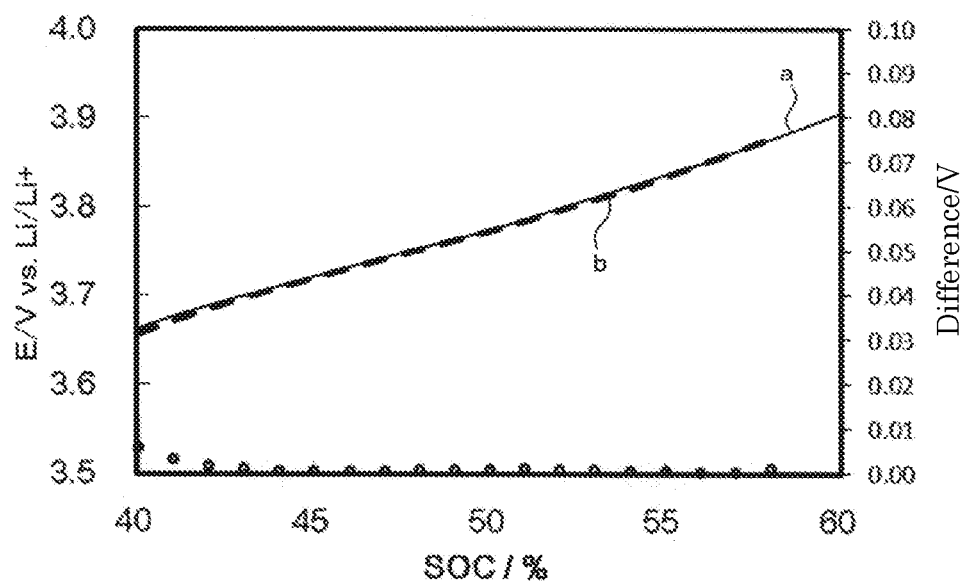
FIG. 11 is a graph illustrating a difference between an SOC-OCV curve a in FIG. 9 and a reference SOC-OCV curve b in FIG. 10.

FIG. 11 is a graph illustrating a difference between the SOC-OCV curve a in FIG. 9 and the reference SOC-OCV curve b in FIG. 10. The horizontal axis indicates the SOC (%), the left vertical axis indicates the charge-discharge voltage value E (the potential difference based on the equilibrium potential VvsLi/Li+:Li/Li+), and the right vertical axis indicates the difference (V). The difference is obtained by the following formula.

Difference=|(voltage value of reference SOC-OCV curve)–(voltage value of measured SOC-OCV curve)|

It was checked that the reference SOC-OCV curve obtained by the above method was matched with the reference SOC-OCV curve obtained by the measurement. That is, the shape of the reference SOC-OCV curve from the lower limit voltage value to the reached upper limit voltage is matched with the shape of the discharge curve during the full discharge at the same voltage.

As proved by the result in FIG. 7, the SOC can be estimated with high accuracy using the reference SOC-OCV curve obtained by the above method.

The reference SOCOCV curve corresponding the lower limit voltage value to each reached voltage value can easily be obtained by the above method. Only the full discharge SOCOCV curve and the full charge SOC-OCV curve are actually measured, and the work amount to be previously examined is significantly reduced.

As compared with the case where the curve to be located between the adjacent SOC-OCV curves is supplemented by the interpolation calculation, the reference SOC-OCV curve corresponding to each reached voltage value is directly generated from the measured full charge-discharge SOC-OCV curve, so that the accuracy of the SOC estimation is improved.

When the SOC-OCV curve changes with use, the reference SOC-OCV curve is generated according to the degradation of the energy storage device. In this case, only the full charge-discharge SOC-OCV curve is actually measured, and the work amount is significantly reduced in the use period of the energy storage device. The SOC is preferably estimated from the current electrochemical behavior and use history.

First Embodiment

A first embodiment will be described below by taking an energy storage module mounted on a vehicle as an example.

Figure 12:
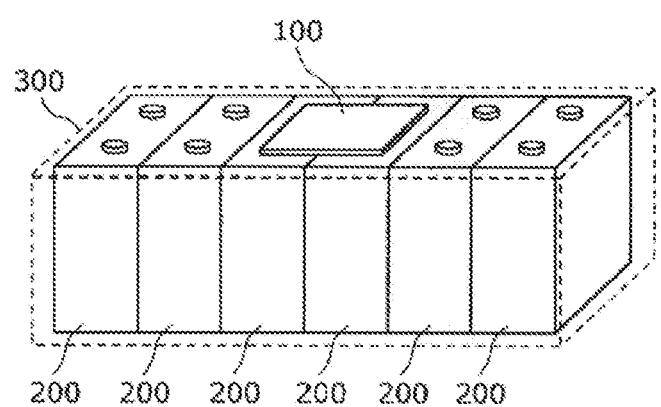
FIG. 12 is a perspective view illustrating an example of an energy storage module.

FIG. 12 illustrates an example of the energy storage module. An energy storage module 50 includes a plurality of energy storage devices 200, a monitoring device 100, and a housing case 300 that stores the plurality of energy storage devices 200 and the monitoring device 100. The energy storage module 50 may be used as a power source for an electric vehicle (EV) or a plug-in hybrid electric vehicle (PHEV).

The energy storage device 200 is not limited to a prismatic cell, but may be a cylindrical cell or a pouch cell.

The monitoring device 100 may be a circuit board disposed opposite to the plurality of energy storage devices 200. The monitoring device 100 monitors a state of the energy storage device 200. The monitoring device 100 may be a storage amount estimation device. Alternatively, a computer or a server that is connected to the monitoring device 100 in a wired or wireless manner may perform a storage amount estimation method based on information output from the monitoring device 100.

Figure 13:
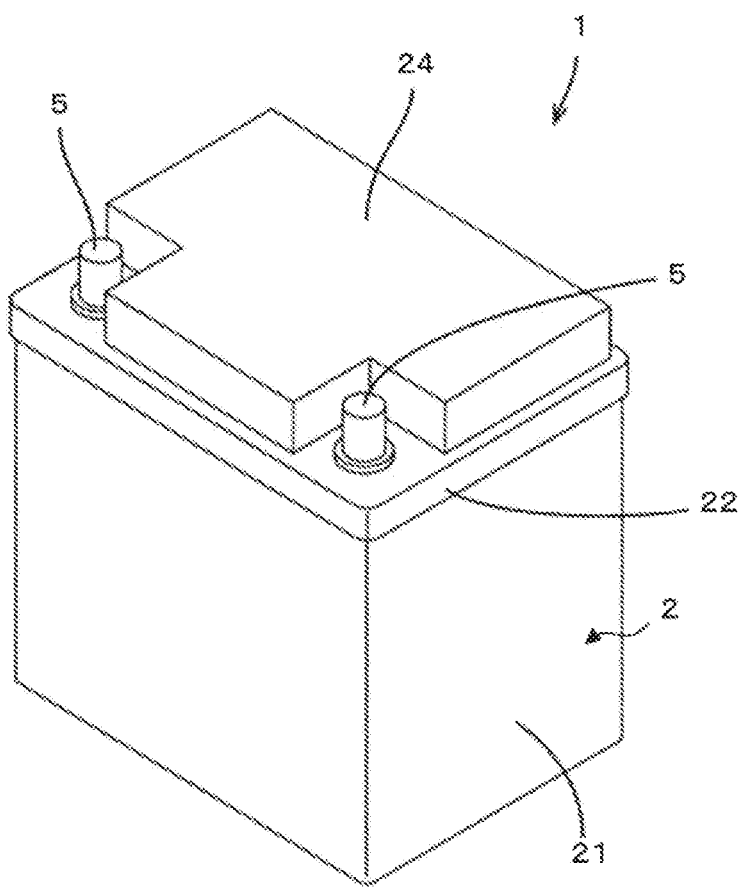
FIG. 13 is a perspective view illustrating another example (battery module) of the energy storage module.
Figure 14:
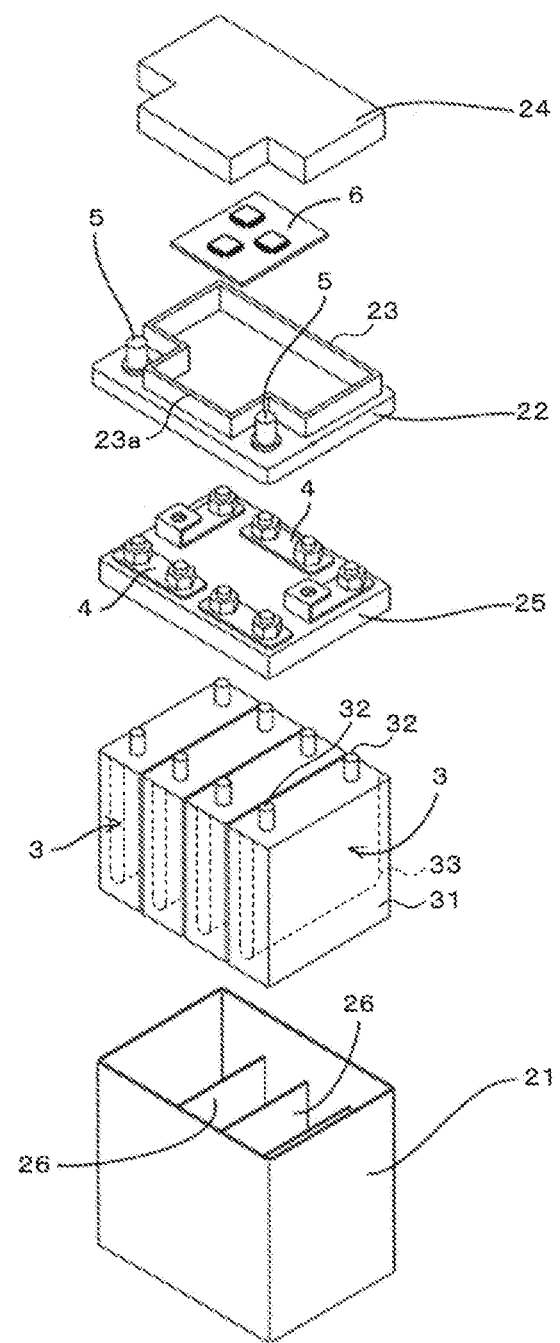
FIG. 14 is an exploded perspective view of a battery module of FIG. 13.
Figure 15:
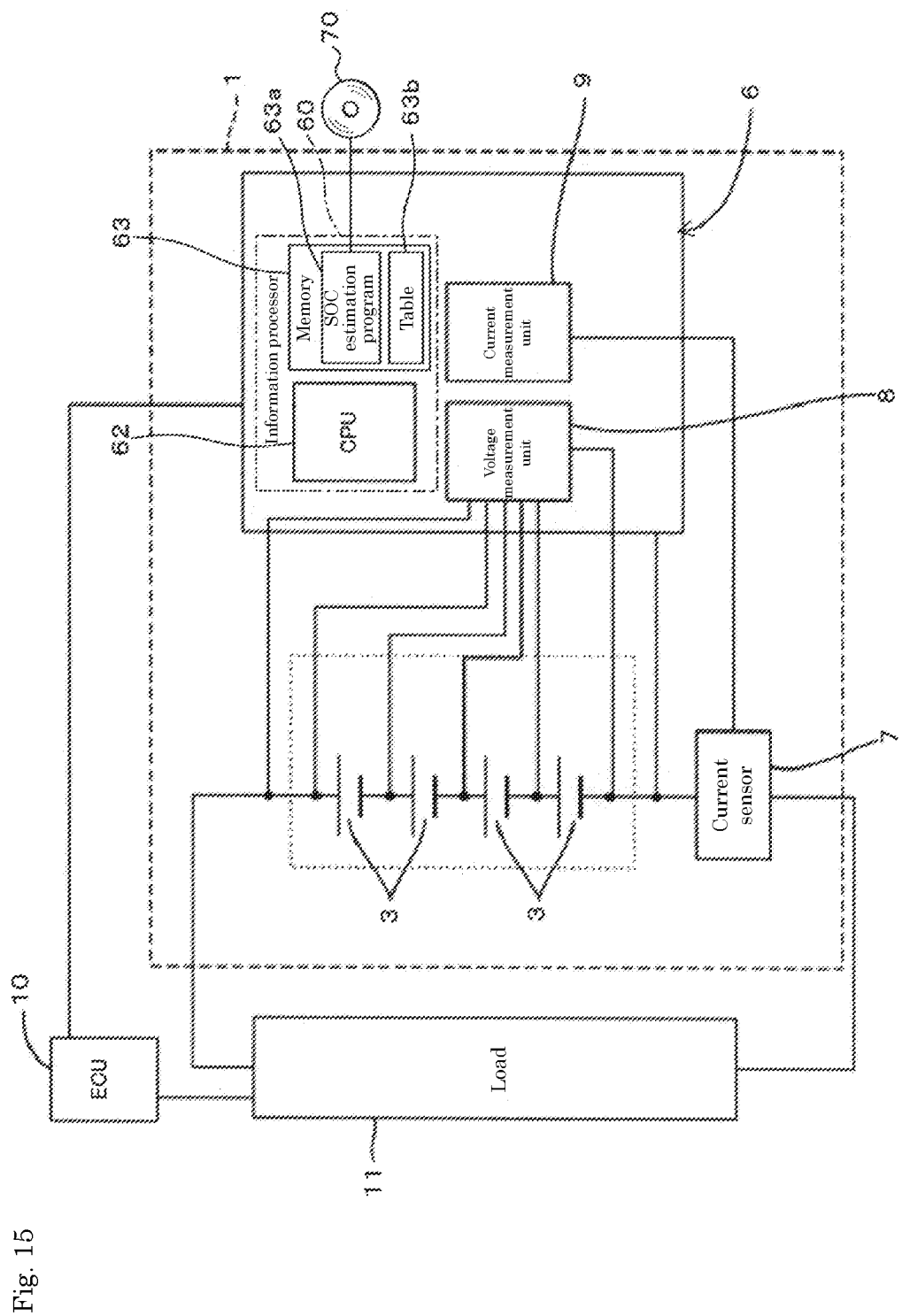
FIG. 15 is a block diagram of the battery module.

FIG. 13 illustrates another example of the energy storage module. The energy storage module (hereinafter, referred to as a battery module) 1 may be a 12-volt power supply or a 48-volt power supply that is suitably mounted on an engine vehicle. FIG. 13 is a perspective view of a battery module 1 for a 12-V power supply, FIG. 14 is an exploded perspective view of the battery module 1, and FIG. 15 is a block diagram of the battery module 1.

The battery module 1 has a rectangular parallelepiped case 2. A plurality of lithium ion secondary batteries (hereinafter referred to as batteries) 3, a plurality of bus bars 4, a BMU (Battery Management Unit) 6, and a current sensor 7 are accommodated in the case 2.

The battery 3 includes a rectangular parallelepiped case 31 and a pair of terminals 32, 32 that is provided on one side surface of the case 31 and having different polarities. The case 31 houses an electrode assembly 33 in which a positive electrode plate, a separator, and a negative electrode plate are laminated.

At least one of a positive active material included in the positive electrode plate and a negative active material included in the negative electrode plate of the electrode assembly 33 generates at least two electrochemical reactions depending on a transition of charge-discharge. A hysteresis of a storage amount-voltage value characteristic exhibiting during the generation of one electrochemical reaction is smaller than a hysteresis during the generation of the other electrochemical reaction.

Examples of the positive active material include Li-excess active materials such as the above $LiMeO_2$—$Li_2MnO_3$ solid solution, a $Li_2OLiMeO_2$ solid solution, a $Li_3NbO_4$—$LiMeO_2$ solid solution, a $Li_4WO_5$—$LiMeO_2$ solid solution, a $Li_4TeO_5$—$LiMeO_2$ solid solution, a $Li_3SbO_4$—$LiFeO_2$ solid solution, a $Li_2RuO_3$—$LiMeO_2$ solid solution, and a $Li_2RuO_3$—$Li_2MeO_3$ solid solution. Examples of the negative active materials include hard carbon, metals such as Si, Sn, Cd, Zn, Al, Bi, Pb, Ge, and Ag or alloys thereof, or chalcogenides containing these. SiO can be cited as an example of the chalcogenide.

The technique of the present invention is applicable as long as at least one of the positive active materials and negative active materials is contained.

The case 2 is made of a synthetic resin. The case 2 includes a case body 21, a lid 22 that closes an opening of the case body 21, a BMU housing 23 provided on an outer surface of the lid 22, a cover 24 covering the BMU housing 23, an inner lid 25, and a partition plate 26. The inner lid 25 and the partition plate 26 may not be provided.

The battery 3 is inserted between the partition plates 26 of the case body 21.

A plurality of metal bus bars 4 are placed on the inner lid 25. The inner lid 25 is disposed on a terminal surface on which the terminal 32 of the battery 3 is provided, the adjacent terminals 32 of the adjacent batteries 3 are connected to each other by the bus bar 4, and the batteries 3 are connected in series.

The BMU housing 23 has a box shape, and includes a protrusion 23a protruding outward in a prismatic shape in a central portion of one long side surface. A pair of external terminals 5, 5 that are made of metal such as a lead alloy and has different polarities is provided on both sides of the protrusion 23a in the lid 22. The BMU 6 is configured by mounting an information processor 60, a voltage measuring unit 8, and a current measuring unit 9 on a substrate. The BMU 6 is housed in the BMU housing 23 and the BMU housing 23 is covered with the cover 24, whereby the battery 3 and the BMU 6 are connected to each other.

As illustrated in FIG. 15, the information processor 60 includes a CPU 62 and a memory 63.

The memory 63 stores an SOC estimation program 63a of the embodiment and a table 63b that stores a full charge SOC-OCV curve and a discharge SOC-OCV curve. The SOC-OCV curve is not limited to the case where the SOC-OCV curve is stored in the table 63b, but may be stored in the memory 63 as a numerical expression.

The full charge SOC-OCV curve and the discharge SOC-OCV curve are obtained by measurement at predetermined time intervals. As the battery 3 is degraded, the charge-discharge SOC-OCV curve is updated. The charge-discharge SOC-OCV curve may be measured each time the battery 3 is used.

The SOC estimation program 63a is provided while stored in a computer-readable recording medium 70 such as a CD-ROM, DVD-ROM, and USB memory, and is stored in the memory 63 by installing the SOC estimation program 63a in the BMU 6. Alternatively, the SOC estimation program 63a may be acquired from an external computer (not illustrated) connected to a communication network, and stored in the memory 63.

The CPU 62 performs an SOC estimation processing (to be described later) according to the SOC estimation program 63a read from the memory 63.

The voltage measuring unit 8 is connected to both ends of the battery 3 via a voltage detection line, and measures the voltage value of each battery 3 at predetermined time intervals.

The current measuring unit 9 measures a current value passed through the battery 3 via the current sensor 7 at predetermined time intervals.

The external terminals 5, 5 of the battery module 1 are connected to a starter motor that starts the engine and a load 11 such as an electric component.

An ECU (Electronic Control Unit) 10 is connected to the BMU 6 and the load 11.

The SOC estimation method of the first embodiment will be described below.

Figure 16:
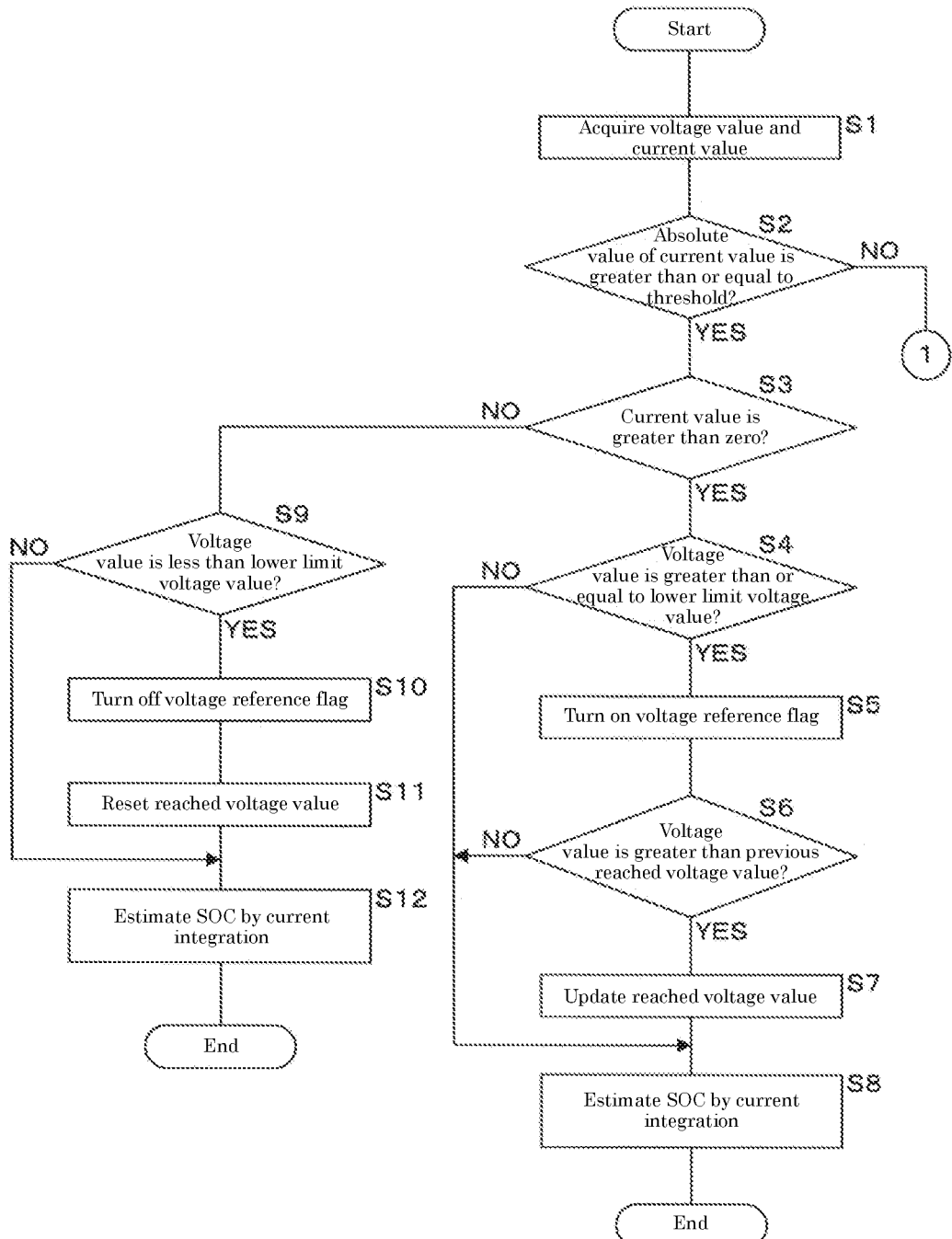
FIG. 16 is a flowchart illustrating a procedure of SOC estimation processing by the CPU.
Figure 17:
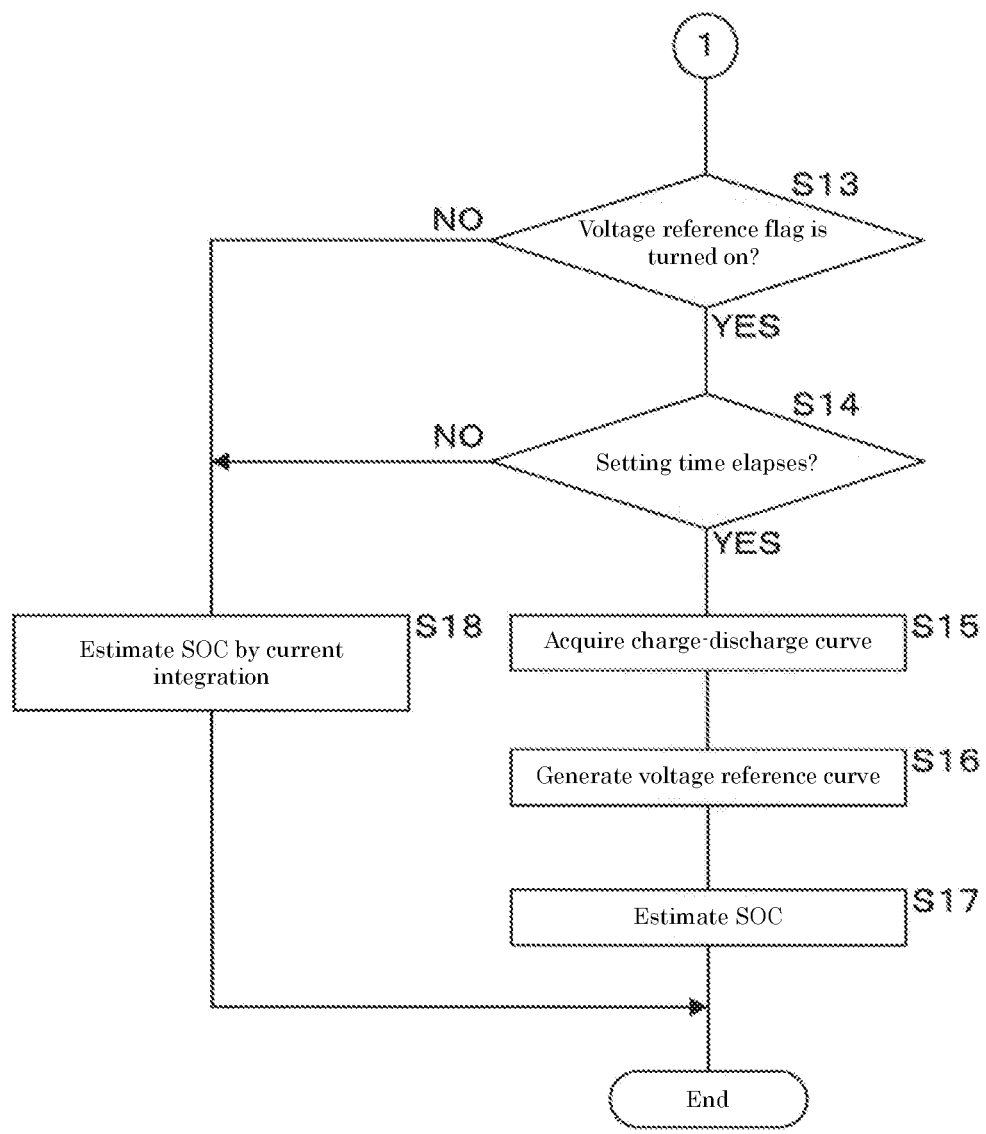
FIG. 17 is a flowchart illustrating the procedure of the SOC estimation processing by the CPU.

FIGS. 16 and 17 are flowcharts illustrating a procedure of the SOC estimation processing performed by the CPU 62. The CPU 62 repeats pieces of processing from S1 at predetermined intervals.

The CPU 62 acquires the voltage value and the current value between the terminals of the battery 3 (S1). Because the lower limit voltage value and the reached voltage value (to be described later) are the OCV, it is necessary to correct the acquired voltage value to OCV when the current amount of the battery 3 is large. The correction value to OCV is obtained by estimating the voltage value at the current value of zero using a regression line from the data of the pluralities of voltage values and current values. When the amount of current flowing through the battery 3 is as small as a dark current (a minute current), the acquired voltage value can be regarded as OCV.

The CPU 62 determines whether an absolute value of the current value is greater than or equal to a threshold (S2). The threshold is set in order to determine whether the battery 3 is in a charge state, a discharge state, or a resting state. When the CPU 62 determines that the absolute value of the current value is less than the threshold (NO in S2), the processing proceeds to S13.

When the CPU 62 determines that the absolute value of the current value is greater than or equal to the threshold (YES in S2), the CPU 62 determines whether the current value is greater than zero (S3). It is determined that the battery 3 is in the charge state when the current value is larger than zero. When the CPU 62 determines that the current value is less than zero (NO in S3), the processing proceeds to S9.

When determining that the current value is greater than zero (YES in S3), the CPU 62 determines whether the voltage value is greater than or equal to the lower limit voltage value (S4). When the CPU 62 determines that the voltage value is less than the lower limit voltage value (NO in S4), the processing proceeds to S8.

When determining that the voltage value is greater than or equal to the lower limit voltage value (YES in S4), the CPU 62 turns on a voltage reference flag (S5).

The CPU 62 determines whether the acquired voltage value is greater than the previous reached voltage value (S6). When the CPU 62 determines that the voltage value is not greater than the previous reached voltage value (NO in S6), the processing proceeds to S8.

When determining that the voltage value is greater than the previous reached voltage value (YES in S6), the CPU 62 updates the voltage value to the reached voltage value in the memory 63 (S7).

The CPU 62 estimates the SOC by the current integration (S8), and ends the processing.

When determining that the current value is less than zero while the battery 3 is in the discharge state, the CPU 62 determines whether the voltage value is less than the lower limit voltage value in S9 (S9). When the CPU 62 determines that the voltage value is greater than or equal to the lower limit voltage value (NO in S9), the processing proceeds to S12.

When determining that the voltage value is less than the lower limit voltage value (YES in S9), the CPU 62 turns off the voltage reference flag (S10).

The CPU 62 resets the reached voltage value (S11).

The CPU 62 estimates the SOC by the current integration (S12), and ends the processing.

When determining that the absolute value of the current value is less than the threshold while the battery 3 is in the resting state, the CPU 62 determines whether the voltage reference flag is turned on (S13). When the CPU 62 determines that the voltage reference flag is not turned on (NO in S13), the processing proceeds to S16.

When determining that the voltage reference flag is turned on (YES in S13), the CPU 62 determines whether a setting time elapses since the battery 3 is determined to be in the resting state in S2 (S14). As for the setting time, a sufficient time for considering the acquired voltage value as the OCV is previously obtained by an experiment. It is determined whether the setting time exceeds the time based on the number of acquisition times and the acquisition interval of the current value after the battery 3 is determined to be in the resting state. Consequently, the SOC can be estimated with higher accuracy in the resting state.

When the CPU 62 determines that the setting time does not elapse (NO in S14), the processing proceeds to S18.

The CPU 62 estimates the SOC by the current integration in S18, and ends the processing.

When the CPU 62 determines that the setting time elapses (YES in S14), the acquired voltage value can be regarded as the OCV.

The CPU 62 reads the charge-discharge SOC-OCV curve from the table 63b (S15).

The CPU 62 generates the reference SOC-OCV curve (S16). The CPU 62 moves the discharge SOC-OCV curve in parallel to the horizontal axis such that a first point corresponding to the reached voltage value on the discharge SOC-OCV curve overlaps a second point corresponding to the reached voltage value on the charge SOC-OCV curve. That is, the discharge SOC-OCV curve is translated by ΔSOC. The curve is cut from the lower limit voltage value to the reached voltage value to generate the reference SOCOCV curve.

The CPU 62 reads the SOC corresponding to the voltage value acquired in S1 in the reference SOC-OCV curve to estimate the SOC (S17), and ends the processing.

When the charge-discharge is repeated, the voltage value rises and falls, namely, a high inflection point among inflection points where the charge is switched to the discharge is set to the reached voltage value.

The voltage value acquired from the voltage measuring unit 8 by the CPU 62 varies somewhat depending on the current value, so that the voltage value can be corrected by obtaining a correction coefficient through the experiment.

As described above, in the first embodiment, the hysteresis is small (substantially no hysteresis), and the SOC is estimated based on the reference SOC-OCV curve and the current voltage value in the range from the lower limit voltage value to the reached voltage value, so that the estimation of SOC can be estimated with high accuracy. Thus, the OCV reset can be performed with high accuracy.

The SOC can be estimated in both the charge and the discharge. When the charge-discharge is repeated with the complicated pattern by setting the inflection point of rise and fall of the voltage value to the reached voltage value to generate the reference SOC-OCV curve, the SOC can be estimated only from the history of the voltage value. Only when the acquired voltage value exceeds the previous reached voltage value, the update of the reached voltage value can accurately estimate the SOC as compared with Patent Document 1 that selects the SOC-OCV curve based on the final voltage value during the charge.

In the first embodiment, the reference SOC-OCV curve is generated by translating the discharge SOC-OCV curve by ΔSOC based on the reached voltage value stored in the memory 63. The reference SOC-OCV curve corresponding to all the reached voltage values is generated from one discharge SOC-OCV curve. It is not necessary to store the reference SOC-OCV curve in the memory 63 by the measurement for each reached voltage value. That is, the reference SOC-OCV curve corresponding the lower limit voltage value to each reached voltage value can easily be obtained. Only the full charge-discharge SOC-OCV curve is actually measured, which significantly reduces the work amount.

As compared with the case where the curve to be located between the measured adjacent SOC-OCV curves is supplemented by the interpolation calculation, the accuracy of the SOC estimation is improved.

When the reference SOC-OCV curve is acquired according to the degradation of the battery 3, only the full charge-discharge SOC-OCV curve is actually measured, and the work amount is significantly reduced in the use period of the battery 3.

Because the SOC can be estimated from the SOC-OCV curve, the storage amount is not limited to the SOC, but the current amount of energy, such as amount of power, which is stored in the battery 3, can be estimated.

Second Embodiment

The case where the SOC is estimated in real time will be described in a second embodiment. The configuration is the same as that of the first embodiment except for the SOC estimation processing performed by the CPU 62.

The SOC estimation processing performed by the CPU 62 of the second embodiment will be described below.

Figure 18:
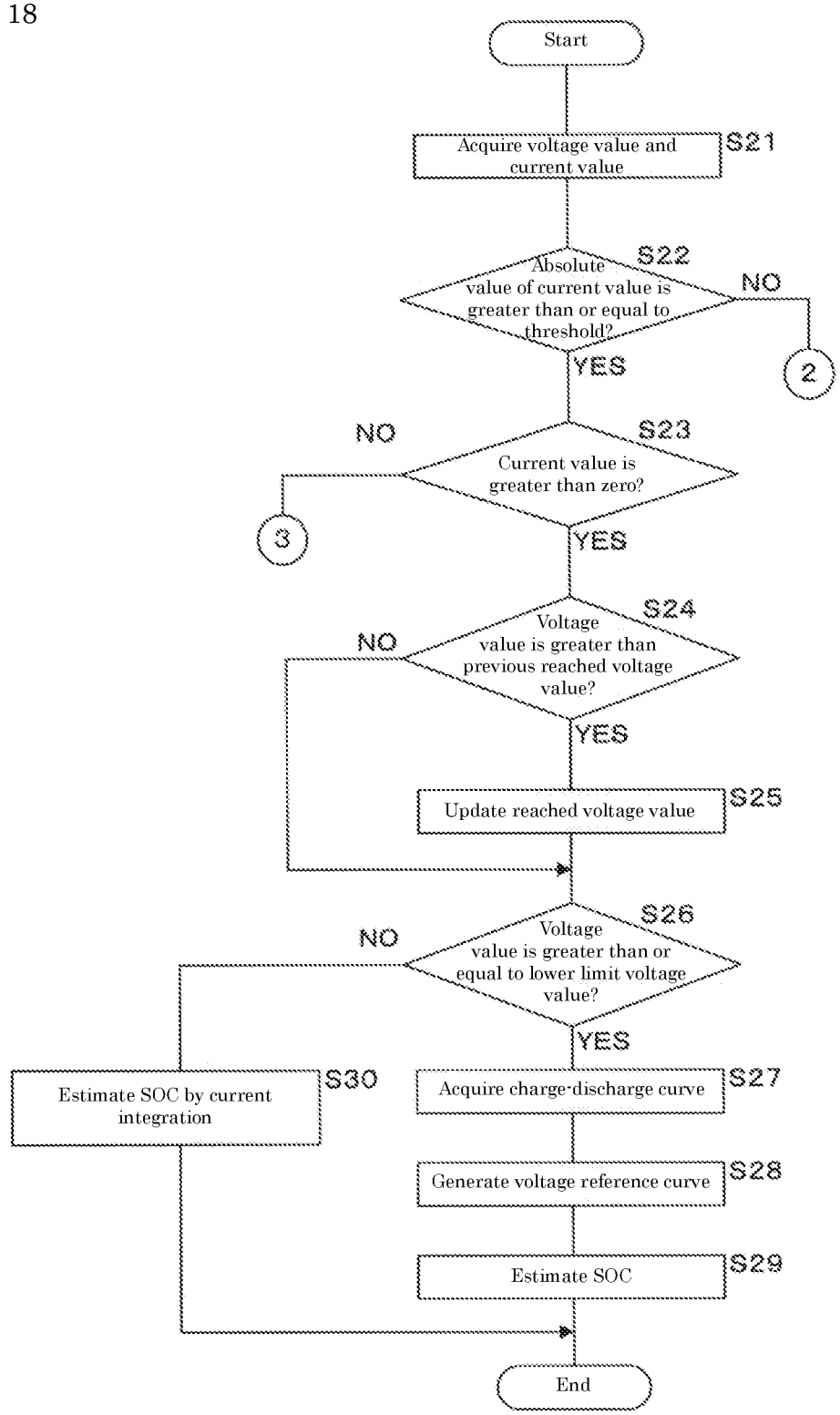
FIG. 18 is a flowchart illustrating the procedure of the SOC estimation processing by the CPU.
Figure 19:
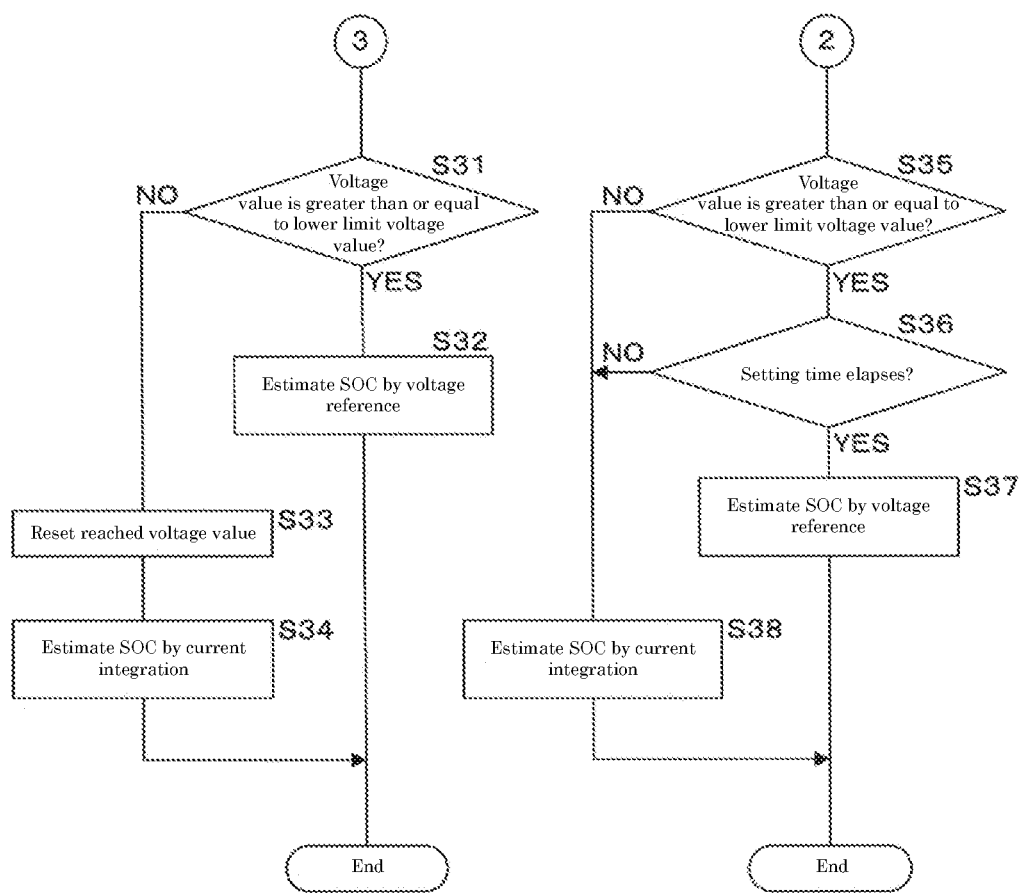
FIG. 19 is a flowchart illustrating the procedure of the SOC estimation processing by the CPU.

FIGS. 18 and 19 are flowcharts illustrating the procedure of the SOC estimation processing performed by the CPU 62. The CPU 62 repeats the pieces of processing from S21 at predetermined intervals.

The CPU 62 acquires the voltage value and the current value between the terminals of the battery 3 (S21).

The CPU 62 determines whether the absolute value of the current value is greater than or equal to a threshold (S22). The threshold is set in order to determine whether the battery 3 is in a charge state, a discharge state, or a resting state. When the CPU 62 determines that the absolute value of the current value is less than the threshold (NO in S22), the processing proceeds to S33.

When determining that the absolute value of the current value is greater than or equal to the threshold (YES in S22), the CPU 62 determines whether the current value is greater than zero (S23). When the current value is larger than zero, the battery 3 is in the charge state. When the CPU 62 determines that the current value is not greater than zero (NO in S23), the processing proceeds to S29.

When determining that the current value is greater than zero (YES in S23), the CPU 62 determines whether the voltage value is greater than the previous reached voltage value (S24). For example, the voltage value may be corrected by estimating the value when the current value of zero, using a regression straight line from the data of pluralities of voltage values and current values. When the CPU 62 determines that the voltage value is not greater than the previous reached voltage value (NO in S24), the processing proceeds to S26.

When determining that the voltage value is larger than the previous reached voltage value (YES in S24), the CPU 62 updates the voltage value to the reached voltage value (S25).

The CPU 62 determines whether the voltage value is greater than or equal to the lower limit voltage value (S26). When determining that the voltage value is less than the lower limit voltage value (NO in S26), the CPU 62 estimates the SOC by the current integration (S30), and ends the processing.

When determining that the voltage value is greater than or equal to the lower limit voltage value (YES in S26), the CPU 62 reads the charge-discharge SOC-OCV curve from the table 63b (S27).

The CPU 62 generates the reference SOC-OCV curve (S28). The CPU 62 moves the discharge SOC-OCV curve in parallel to the horizontal axis such that a first point corresponding to the reached voltage value on the discharge SOC-OCV curve overlaps a second point corresponding to the reached voltage value on the charge SOC-OCV curve. That is, the discharge SOC-OCV curve is translated by ΔSOC. The CPU 62 cuts the curve from the lower limit voltage value to the reached voltage value to generate the reference SOC-OCV curve.

The CPU 62 reads the SOC from the current OCV in the reference SOC-OCV curve to estimate the SOC (S29), and ends the processing. The CPU 62 calculates the current OCV from the voltage value and the current value acquired in S21. The OCV can be calculated by estimating the voltage value at the current value of zero using the regression line from the data of the pluralities of voltage values and current values. When the current value is as small as the dark current value, the acquired voltage value can be read as the OCV.

When determining that the current value is smaller than zero and the battery 3 is in the discharge state, the CPU 62 determines whether the voltage value is greater than or equal to the lower limit voltage value in S29 (S31).

When determining that the voltage value is greater than or equal to the lower limit voltage value (YES in S31), the CPU 62 estimates the SOC by the voltage reference in the same manner as described above (S32).

When determining that the voltage value is less than the lower limit voltage value (NO in S31), the CPU 62 resets the reached voltage value (S33).

The CPU 62 estimates the SOC by the current integration (S34), and ends the processing.

When determining that the absolute value of the current value is less than the threshold and the battery 3 is in the resting state, the CPU 62 determines whether the voltage value is greater than or equal to the lower limit voltage value (S35). When the CPU 62 determines that the voltage value is less than the lower limit voltage value (NO in S36), the processing proceeds to S38.

When determining that the voltage value is greater than or equal to the lower limit voltage value (YES in S36), the CPU 62 determines whether the setting time elapses since the battery 3 is determined to be in the resting state in S22 (S36). As for the setting time, a sufficient time for considering the acquired voltage value as the OCV is previously obtained by an experiment.

When the CPU 62 determines that the setting time does not elapse (NO in S36), the processing proceeds to S38.

The CPU 62 estimates the SOC by the current integration (S38), and ends the processing.

When the CPU 62 determines that the setting time elapses (YES in S36), the acquired voltage value can be regarded as the OCV, the SOC is estimated by the voltage reference in the same manner as described above (S37), and the processing is ended.

In the second embodiment, the SOC can be estimated in real time during the charge-discharge.

The SOC is estimated based on the reference SOC-OCV curve and the current voltage value in the range from the lower limit voltage value to the reached voltage value, the hysteresis being substantially free in the range. Thus, the SOC is accurately estimated.

Based on the reached voltage value stored in the memory 63, the discharge SOC-OCV curve stored in the table 63b is translated by ΔSOC to generate the reference SOC-OCV curve. The reference SOC-OCV curve corresponding to all the reached voltage values is generated from one discharge SOC-OCV curve. It is not necessary to store the reference SOC-OCV curve in the memory 63 by the measurement for each reached voltage value. That is, the reference SOC-OCV curve corresponding the lower limit voltage value to each reached voltage value can easily be obtained. Only the full charge-discharge SOC-OCV curve is actually measured, which significantly reduces the work amount.

As compared with the case where the curve to be located between the measured adjacent SOC-OCV curves is supplemented by the interpolation calculation, the accuracy of the SOC estimation is improved.

When the reference SOC-OCV curve is acquired according to the degradation of the battery 3, only the full charge-discharge SOC-OCV curve is actually measured, and the work amount is significantly reduced in the use period of the battery 3.

Because the SOC can be estimated from the SOC-OCV curve, the storage amount is not limited to the SOC, but the current amount of energy, such as amount of power, which is stored in the battery 3, can be estimated.

The SOC can be estimated in both the charge and the discharge. Even if the charge-discharge are repeated with the complicated pattern, the SOC can be estimated based only on the history of the voltage values.

Because of the use of the voltage value, the storage amount is not limited to the SOC, and the current amount of energy, such as amount of power, which is stored in the battery 3, can be estimated.

As described above, a storage amount estimation device that estimates a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge during generation of one of the electrochemical reactions being smaller than a hysteresis during generation of the other electrochemical reaction in the active material, the storage amount estimation device includes an estimator that estimates the storage amount using a voltage reference storage amount-voltage value characteristic obtained based on the storage amount-voltage value discharge characteristic when the one electrochemical reaction is generated more than the other electrochemical reaction.

In the above configuration, when one electrochemical reaction in which the charge and the discharge are substantially matched with each other in the change in voltage value with respect to the storage amount is mainly generated, the storage amount is estimated based on the voltage reference storage amount-voltage value characteristic.

In the region where one electrochemical reaction is mainly generated, only one electrochemical reaction is generated as the discharge reaction. The discharge electric quantity of one electrochemical reaction in the region can be regarded as the charge electric quantity of one electrochemical reaction. That is, the same voltage reference storage amount-voltage value characteristic can be used when the storage amount is estimated in the charge state and the discharge state.

The storage amount-voltage value charge characteristic and the storage amount-voltage value discharge characteristic are acquired. The voltage reference storage amount-voltage value characteristic can easily be acquired using the storage amount-voltage value discharge characteristic in which one electrochemical reaction is generated.

The storage amount of the high-capacity energy storage device containing the active material having the storage amount-voltage value characteristic exhibiting the hysteresis can easily and satisfactorily be estimated.

Because of the use of the voltage value, the storage amount is not limited to the SOC, and the current amount of energy, such as amount of power, which is stored in the energy storage device, can be estimated. The dischargeable energy up to SOC 0% and the charge energy required up to SOC 100% can be predicted based on the charge-discharge curve.

In the storage amount estimation device, when the one electrochemical reaction is generated more than the other electrochemical reaction, the storage amount is estimated based on a difference in storage amount between a storage amount-voltage value charge characteristic and a storage amount-voltage value discharge characteristic at an identical voltage value and the voltage reference storage amount-voltage value characteristic obtained by moving the storage amount-voltage value discharge characteristic toward the storage amount-voltage value charge characteristic.

The storage amount-voltage value charge characteristic and the storage amount-voltage value discharge characteristic are acquired. The difference between the storage amounts of both the characteristics at the identical voltage value (Δ storage amount) corresponds to another electrochemical reaction. One electrochemical reaction and the other electrochemical reaction are substantially independently generated. The reaction amount of the other electrochemical reaction corresponds to the Δ storage amount, and hardly affects one electrochemical reaction.

In the above configuration, the voltage reference storage amount-voltage value characteristic is obtained by moving the difference in storage amount between the storage amount-voltage value charge characteristic and the storage amount-voltage value discharge characteristic at the same voltage value and the storage amount-voltage value discharge characteristic toward the storage amount-voltage value charge characteristic. That is, the voltage reference storage amount-voltage value characteristic starting from each voltage value has the shape, in which the same storage amount-voltage value discharge characteristic is moved toward the storage amount-voltage value charge characteristic based on the same one electrochemical reaction and the voltage value at each starting point is cut as the upper end.

According to the above configuration, the storage amount is accurately estimated.

Preferably the storage amount estimation device further includes: a voltage acquisition unit that acquires a voltage value of the energy storage device; and a setting unit that sets a reached voltage value based on a voltage value after the voltage value acquired by the voltage acquisition unit is higher than a lower limit voltage value at which existence of the hysteresis is substantially switched. The identical voltage value is the reached voltage value.

In the above configuration, based on the increase or decrease in voltage value, the reached voltage value is set to generate the voltage reference storage amount-voltage value characteristic. Even in the case where the charge-discharge is repeated with the complicated pattern, the voltage reference storage amount-voltage value characteristic can be generated only by the history of the voltage value to estimate the storage amount.

In the storage amount estimation device, preferably the estimator refers to the voltage reference storage amount-voltage value characteristic to estimate the storage amount when the voltage value acquired by the voltage acquisition unit exists between the lower limit voltage value and the reached voltage value.

The reaction amount of the other electrochemical reaction is small in the range from the lower limit voltage value to the reached voltage value, one electrochemical reaction being mainly generated and the hysteresis being small in the range. One electrochemical reaction is mainly generated in the charge-discharge reaction. In the above configuration, in this case, the storage amount is estimated based on the voltage reference storage amount-voltage value characteristic and the acquired voltage value. Thus, the storage amount is accurately estimated.

In the storage amount estimation device, preferably the setting unit stores the reached voltage value in a storage unit, and updates the acquired voltage value to the reached voltage value when the voltage value acquired by the voltage acquisition unit is larger than the reached voltage value previously stored in the storage unit.

The storage amount can accurately be estimated by generating the voltage reference storage amount-voltage value characteristic based on the updated reached voltage value.

In the storage amount estimation device, preferably the storage amount is an SOC.

The estimation of the SOC for a high-capacity material improves applicability to the existing control system. Based on the SOC, the storage amount such as the dischargeable energy can easily be calculated. The storage amount estimation device can accurately estimate the charge state of the energy storage device in which the electrode material having the hysteresis is used with no use of a special sensor or additional component, the OCV and the SOC not corresponding to each other on a one-to-one manner in the electrode material.

The energy storage module includes a plurality of energy storage devices and any one of the above storage amount estimation devices.

In the energy storage module for the vehicle or the industrial energy storage module, typically the plurality of energy storage devices are connected in series. Sometimes the plurality of energy storage devices are connected in series and in parallel. In order to exert performance of the energy storage module, it is necessary to accurately estimate the storage amount of each energy storage device and to perform balancing processing when the storage amount varies among a plurality of energy storage devices. Even if each energy storage device has the high capacity, the performance of the energy storage module cannot be utilized to the fullest unless the variation in storage amount among the plurality of energy storage devices can be detected. The storage amount of each energy storage device is accurately estimated by the storage amount estimation device, so that the performance of the energy storage module can be exerted at the maximum. The energy storage module is suitably used as a power source for an EV or a PHEV that has a particularly high demand for the high capacity.

According to another aspect of the present invention, a storage amount estimation method for estimating a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge during generation of one of the electrochemical reactions being smaller than a hysteresis during generation of the other electrochemical reaction in the active material, the storage amount estimation method includes: acquiring a voltage reference storage amount-voltage value characteristic obtained based on the storage amount-voltage value discharge characteristic when the one electrochemical reaction is generated more than the other electrochemical reaction; and estimating the storage amount based on the voltage reference storage amount-voltage value characteristic.

In the above method, when one electrochemical reaction in which the charge and the discharge are substantially matched with each other in the change in voltage value with respect to the storage amount is considerably generated, the storage amount is estimated based on the voltage reference storage amount-voltage value characteristic.

In the region where one electrochemical reaction is considerably generated, only one electrochemical reaction is generated as the discharge reaction. The discharge electric quantity of one electrochemical reaction in the region can be regarded as the charge electric quantity of one electrochemical reaction. That is, the same voltage reference storage amount-voltage value characteristic can be used when the storage amount is estimated in the charge state and the discharge state.

The storage amount-voltage value charge characteristic and the storage amount-voltage value discharge characteristic are acquired. The voltage reference storage amount-voltage value characteristic can easily be acquired using the storage amount-voltage value discharge characteristic in which one electrochemical reaction is generated.

Only the storage amount-voltage value discharge characteristic and the storage amount-voltage value charge characteristic are actually measured, and a work amount is small.

As compared with the case where the voltage reference storage amount-voltage value characteristic to be located between the adjacent voltage reference storage amount-voltage value characteristics is supplemented by the interpolation calculation, the voltage reference storage amount-voltage value characteristic is generated corresponding to each reached voltage value, so that the accuracy of the storage amount estimation is improved.

When the voltage reference storage amount-voltage value characteristic is acquired according to the degradation of the energy storage device, only the storage amount-voltage value discharge characteristic and the storage amount-voltage value charge characteristic are actually measured, and the work amount is small in a use period of the energy storage device.

The storage amount of the high-capacity energy storage device containing the active material having the storage amount-voltage value characteristic exhibiting the hysteresis can easily and satisfactorily be estimated.

The storage amount can be estimated in both the charge and the discharge. The inflection point relating to the increase or decrease of the voltage value is set to the reached voltage value to select the storage amount-voltage value characteristic. Even if the charge-discharge are repeated with the complicated pattern, the storage amount can be estimated based only on the history of the voltage values.

Because of the use of the voltage value, the storage amount is not limited to the SOC, and the current amount of energy, such as amount of power, which is stored in the energy storage device, can be estimated.

Preferably the storage amount estimation method further includes: setting a reached voltage value based on a voltage value after the acquired voltage value is higher than a lower limit voltage value at which existence of the hysteresis is substantially switched; acquiring a difference in storage amount between the storage amount-voltage value charge characteristic and the storage amount-voltage value discharge characteristic at the reached voltage value and the voltage reference storage amount-voltage value characteristic obtained by moving the storage amount-voltage value discharge characteristic toward the storage amount-voltage value charge characteristic; and referring to the voltage reference storage amount-voltage value characteristic to estimate the storage amount when the acquired voltage value exists between the lower limit voltage value and the reached voltage value.

The storage amount-voltage value charge characteristic and the storage amount-voltage value discharge characteristic are acquired. The difference between the storage amounts of both the characteristics at the identical voltage value (Δ storage amount) corresponds to another electrochemical reaction. The reaction amount of the other electrochemical reaction corresponds to the Δ storage amount, and hardly affects one electrochemical reaction.

For this reason, the voltage reference storage amount-voltage value characteristic can easily be acquired by performing the correction using the Δ storage amount based on the storage amount-voltage value discharge characteristic in which one electrochemical reaction is generated. That is, the voltage reference storage amount-voltage value characteristic starting from each voltage value has the shape, in which the same storage amount-voltage value discharge characteristic is moved toward the storage amount-voltage value charge characteristic based on the same one electrochemical reaction and the voltage value at each starting point is cut as the upper end.

In the above method, based on the increase or decrease in voltage value, the reached voltage value is set to generate the voltage reference storage amount-voltage value characteristic. Even in the case where the charge-discharge is repeated with the complicated pattern, the voltage reference storage amount-voltage value characteristic can be generated only by the history of the voltage value to estimate the storage amount.

In the small-hysteresis range from the lower limit voltage value to the reached voltage value, one electrochemical reaction being generated in the range, the storage amount is estimated based on the voltage reference storage amount-voltage value characteristic and the current voltage value. Thus, the storage amount is accurately estimated.

According to still another aspect of the present invention, a computer program that causes a computer to perform pieces of processing, the computer estimating a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge during generation of one of the electrochemical reactions being smaller than a hysteresis during generation of the other electrochemical reaction in the active material, the pieces of processing includes: acquiring the storage amount-voltage value discharge characteristics and the storage amount-voltage value charge characteristics; determining whether the acquired voltage value is higher than a lower limit voltage value at which existence of the hysteresis is substantially switched; setting the reached voltage value when the voltage value is determined to be higher than the lower limit voltage value;

acquiring a first point on the storage amount-voltage value discharge characteristic, the first point corresponding to the set reached voltage value;

acquiring a second point on the storage amount-voltage value charge characteristic, the second point corresponding to the reached voltage value;

acquiring the voltage reference storage amount-voltage value characteristic by moving the storage amount-voltage value discharge characteristic toward the storage amount-voltage value charge characteristic to overlap the first point on the second point;

determining whether the acquired voltage value exists between the lower limit voltage value and the reached voltage value; and referring to the voltage reference storage amount-voltage value characteristic to estimate the storage amount at the voltage value when the voltage value is determined to exist between the lower limit voltage value and the reached voltage value.

The present invention is not limited to the contents of the above embodiments, but various modifications can be made within the scope of the claims. That is, embodiments obtained by combining technical means appropriately changed within the scope of the claims are also included in the technical scope of the present invention.

The storage amount estimation device of the present invention is not limited to the case where the storage amount estimation device is applied to a vehicle-mounted lithium ion secondary battery, but can also be applied to other energy storage modules such as a railway regeneration power storage device and a solar power generating system. In the energy storage module through which the minute current is passed, the voltage value between the positive electrode terminal and the negative electrode terminal of the energy storage device or the voltage value between the positive electrode terminal and the negative electrode terminal of the energy storage module can be regarded as the OCV.

The energy storage device is not limited to the lithium ion secondary battery, but may be another secondary battery or an electrochemical cell having the hysteresis characteristic.

It is not limited to the case where the monitoring device 100 or the BMU 6 is the storage amount estimation device. A CMU (Cell Monitoring Unit) may be the storage amount estimation device. The storage amount estimation device may be a part of the energy storage module in which the monitoring device 100 or the like is incorporated. The storage amount estimation device may be configured separately from the energy storage device or the energy storage module, and connected to the energy storage module including the energy storage device that is the estimation target of the heat storage amount during the estimation of the heat storage amount. The heat storage amount estimation device may remotely monitor the energy storage device and the energy storage module.

DESCRIPTION OF REFERENCE SIGNS

1, 50 battery module (energy storage module)
2 case
21 case body
22 lid
23 BMU housing
24 cover
25 inner lid
26 partition plate
3, 200 battery (energy storage device)
31 case
32 terminal
33 electrode assembly
4 bus bar
5 external terminal
6 BMU (storage amount estimation device)
60 information processor
62 CPU (estimator, voltage acquisition unit, setting unit, selector)
63 memory (storage unit)
63a SOC estimation program
63b table
7 current sensor
8 voltage measuring unit
9 current measurement unit
10 ECU
70 recoding media
100 monitoring device (storage amount estimation device)
300 housing case

The invention claimed is:

1. A storage amount estimation device that estimates a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge during generation of one of the electrochemical reactions being smaller than a hysteresis during generation of an other electrochemical reaction in the active material, the storage amount estimation device comprising:
a processor coupled to a memory storing instructions, the processor being configured to estimate the storage amount using a voltage reference storage amount-voltage value characteristic obtained by moving the storage amount-voltage value discharge characteristic toward the storage amount-voltage value charge characteristic.

2. The storage amount estimation device according to claim 1, wherein, when the one electrochemical reaction is generated more than the other electrochemical reaction, the storage amount is estimated based on a difference in storage amount between a storage amount-voltage value charge characteristic and a storage amount-voltage value discharge characteristic at an identical voltage value and the voltage reference storage amount-voltage value characteristic.

3. The storage amount estimation device according to claim 2, wherein the processor functions as:
a voltage acquisition unit that acquires a voltage value of the energy storage device; and
a setting unit that sets a reached voltage value based on a voltage value after the voltage value acquired by the voltage acquisition unit is higher than a lower limit voltage value at which existence of the hysteresis is substantially switched,
wherein the identical voltage value is the reached voltage value.

4. The storage amount estimation device according to claim 3, wherein the processor estimate refers to the voltage reference storage amount-voltage value characteristic to estimate the storage amount when the voltage value acquired by the voltage acquisition unit exists between the lower limit voltage value and the reached voltage value.

5. The storage amount estimation device according to claim 3, wherein the setting unit stores the reached voltage value in a storage unit, and updates the acquired voltage value to the reached voltage value when the voltage value acquired by the voltage acquisition unit is larger than the reached voltage value previously stored in the storage unit.

6. The storage amount estimation device according to claim 1, wherein the storage amount comprises state of charge (SOC).

7. An energy storage module comprising:
an energy storage device; and
the storage amount estimation device according to claim 1.

8. A storage amount estimation method for estimating a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge being during generation of one of the electrochemical reactions smaller than a hysteresis during generation of an other electrochemical reaction in the active material,
the storage amount estimation method comprising:
acquiring a voltage reference storage amount-voltage value characteristic obtained by moving the storage amount-voltage, value discharge characteristic toward the storage amount-voltage value charge characteristic; and
estimating the storage amount based on the voltage reference storage amount-voltage value characteristic.

9. The storage amount estimation method according to claim 8, further comprising:
- setting a reached voltage value based on a voltage value after the acquired voltage value is higher than a lower limit voltage value at which existence of the hysteresis is substantially switched;
- acquiring a difference in storage amount between the storage amount-voltage value charge characteristic and the storage amount-voltage value discharge characteristic at the reached voltage value and the voltage reference storage amount-voltage value characteristic; and
- referring to the voltage reference storage amount-voltage value characteristic to estimate the storage amount when the acquired voltage value exists between the lower limit voltage value and the reached voltage value.

10. A non-transitory computer program that causes a computer to perform pieces of processing, the computer estimating a storage amount of an energy storage device in which at least one of a positive electrode and a negative electrode contains an active material, at least two electrochemical reactions being generated in the active material depending on a transition of charge-discharge, a hysteresis between a storage amount-voltage value charge characteristic according to a transition of charge and a storage amount-voltage value discharge characteristic according to a transition of discharge during generation of one of the electrochemical reactions being smaller than a hysteresis during generation of an other electrochemical reaction in the active material, the pieces of processing comprising:
- acquiring the storage amount-voltage value discharge characteristics and the storage amount-voltage value charge characteristics;
- determining whether the acquired voltage value is higher than a lower limit voltage value at which existence of the hysteresis is substantially switched;
- setting the reached voltage value when the voltage value is determined to be higher than the lower limit voltage value;
- acquiring a first point on the storage amount-voltage value discharge characteristic, the first point corresponding to the set reached voltage value;
- acquiring a second point on the storage amount-voltage value charge characteristic, the second point corresponding to the reached voltage value;
- acquiring the voltage reference storage amount-voltage value characteristic by moving the storage amount-voltage value discharge characteristic toward the storage amount-voltage value charge characteristic to overlap the first point on the second point;
- determining whether the acquired voltage value exists between the lower limit voltage value and the reached voltage value; and
- referring to the voltage reference storage amount-voltage value characteristic to estimate the storage amount at the voltage value when the voltage value is determined to exist between the lower limit voltage value and the reached voltage value.

* * * * *